US011775296B2

(12) United States Patent
Willcock

(10) Patent No.: US 11,775,296 B2
(45) Date of Patent: *Oct. 3, 2023

(54) MASK PATTERNS GENERATED IN MEMORY FROM SEED VECTORS

(71) Applicant: Micron Technology, Inc., Boise, ID (US)

(72) Inventor: Jeremiah J. Willcock, Boise, ID (US)

(73) Assignee: Micron Technology, Inc., Boise, ID (US)

(*) Notice: Subject to any disclaimer, the term of this patent is extended or adjusted under 35 U.S.C. 154(b) by 6 days.

This patent is subject to a terminal disclaimer.

(21) Appl. No.: 17/228,518

(22) Filed: Apr. 12, 2021

(65) Prior Publication Data

US 2021/0232397 A1 Jul. 29, 2021

Related U.S. Application Data

(63) Continuation of application No. 15/081,551, filed on Mar. 25, 2016, now Pat. No. 10,977,033.

(51) Int. Cl.
*G06F 9/30* (2018.01)
*G11C 7/06* (2006.01)
*G11C 7/10* (2006.01)

(52) U.S. Cl.
CPC ...... *G06F 9/30018* (2013.01); *G06F 9/30036* (2013.01); *G11C 7/065* (2013.01); *G11C 7/1006* (2013.01); *G11C 7/1009* (2013.01)

(58) Field of Classification Search
CPC .................................................. G06F 9/30018
See application file for complete search history.

(56) References Cited

U.S. PATENT DOCUMENTS

| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,841,438 A * | 6/1989 | Yoshida ............... G06F 15/8084 712/5 |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |

(Continued)

FOREIGN PATENT DOCUMENTS

| CN | 102141905 | 8/2011 |
| EP | 0214718 | 3/1987 |

(Continued)

OTHER PUBLICATIONS

Alliant Libraries; "What is a Boolean Operator?"; May 31, 2010; p. 1 (Year: 2010).*

(Continued)

*Primary Examiner* — William B Partridge
(74) *Attorney, Agent, or Firm* — Brooks, Cameron & Huebsch, PLLC

(57) ABSTRACT

The present disclosure includes apparatuses and methods related to mask patterns generated in memory from seed vectors. An example method includes performing operations on a plurality of data units of a seed vector and generating, by performance of the operations, a vector element in a mask pattern.

19 Claims, 7 Drawing Sheets

(56) References Cited

U.S. PATENT DOCUMENTS

| | | | |
|---|---|---|---|
| 5,034,636 | A | 7/1991 | Reis et al. |
| 5,201,039 | A | 4/1993 | Sakamura |
| 5,210,850 | A | 5/1993 | Kelly et al. |
| 5,253,308 | A | 10/1993 | Johnson |
| 5,276,643 | A | 1/1994 | Hoffman et al. |
| 5,325,519 | A | 6/1994 | Long et al. |
| 5,367,488 | A | 11/1994 | An |
| 5,379,257 | A | 1/1995 | Matsumura et al. |
| 5,386,379 | A | 1/1995 | Ali-Yahia et al. |
| 5,398,213 | A | 3/1995 | Yeon et al. |
| 5,440,482 | A | 8/1995 | Davis |
| 5,446,690 | A | 8/1995 | Tanaka et al. |
| 5,473,576 | A | 12/1995 | Matsui |
| 5,481,500 | A | 1/1996 | Reohr et al. |
| 5,485,373 | A | 1/1996 | Davis et al. |
| 5,506,811 | A | 4/1996 | McLaury |
| 5,615,404 | A | 3/1997 | Knoll et al. |
| 5,638,128 | A | 6/1997 | Hoogenboom |
| 5,638,317 | A | 6/1997 | Tran |
| 5,654,936 | A | 8/1997 | Cho |
| 5,678,021 | A | 10/1997 | Pawate et al. |
| 5,696,954 | A * | 12/1997 | Guttag ............... G06F 12/0284 |
| | | | 708/209 |
| 5,724,291 | A | 3/1998 | Matano |
| 5,724,366 | A | 3/1998 | Furutani |
| 5,751,614 | A * | 5/1998 | Cohen ................. G06F 7/575 |
| | | | 708/231 |
| 5,751,987 | A | 5/1998 | Mahant-Shetti et al. |
| 5,787,458 | A | 7/1998 | Miwa |
| 5,854,636 | A | 12/1998 | Watanabe et al. |
| 5,867,429 | A | 2/1999 | Chen et al. |
| 5,870,504 | A | 2/1999 | Nemoto et al. |
| 5,915,084 | A | 6/1999 | Wendell |
| 5,935,263 | A | 8/1999 | Keeth et al. |
| 5,986,942 | A | 11/1999 | Sugibayashi |
| 5,991,209 | A | 11/1999 | Chow |
| 5,991,785 | A | 11/1999 | Alidina et al. |
| 5,995,748 | A * | 11/1999 | Guttag ............... G06F 12/0284 |
| | | | 708/209 |
| 6,005,799 | A | 12/1999 | Rao |
| 6,009,020 | A | 12/1999 | Nagata |
| 6,092,186 | A | 7/2000 | Betker et al. |
| 6,122,211 | A | 9/2000 | Morgan et al. |
| 6,125,071 | A | 9/2000 | Kohno et al. |
| 6,134,164 | A | 10/2000 | Lattimore et al. |
| 6,147,514 | A | 11/2000 | Shiratake |
| 6,151,244 | A | 11/2000 | Fujino et al. |
| 6,157,578 | A | 12/2000 | Brady |
| 6,163,862 | A | 12/2000 | Adams et al. |
| 6,166,942 | A | 12/2000 | Vo et al. |
| 6,172,918 | B1 | 1/2001 | Hidaka |
| 6,175,514 | B1 | 1/2001 | Henderson |
| 6,181,698 | B1 | 1/2001 | Hariguchi |
| 6,208,544 | B1 | 3/2001 | Beadle et al. |
| 6,226,215 | B1 | 5/2001 | Yoon |
| 6,301,153 | B1 | 10/2001 | Takeuchi et al. |
| 6,301,164 | B1 | 10/2001 | Manning et al. |
| 6,304,477 | B1 | 10/2001 | Naji |
| 6,389,507 | B1 | 5/2002 | Sherman |
| 6,418,498 | B1 | 7/2002 | Martwick |
| 6,466,499 | B1 | 10/2002 | Blodgett |
| 6,510,098 | B1 | 1/2003 | Taylor |
| 6,563,754 | B1 | 5/2003 | Lien et al. |
| 6,578,058 | B1 | 6/2003 | Nygaard |
| 6,731,542 | B1 | 5/2004 | Le et al. |
| 6,754,746 | B1 | 6/2004 | Leung et al. |
| 6,768,679 | B1 | 7/2004 | Le et al. |
| 6,807,614 | B2 | 10/2004 | Chung |
| 6,816,422 | B2 | 11/2004 | Hamade et al. |
| 6,819,612 | B1 | 11/2004 | Achter |
| 6,894,549 | B2 | 5/2005 | Eliason |
| 6,943,579 | B1 | 9/2005 | Hazanchuk et al. |
| 6,948,056 | B1 | 9/2005 | Roth |
| 6,950,771 | B1 | 9/2005 | Fan et al. |
| 6,950,898 | B2 | 9/2005 | Merritt et al. |
| 6,956,770 | B2 | 10/2005 | Khalid et al. |
| 6,961,272 | B2 | 11/2005 | Schreck |
| 6,965,648 | B1 | 11/2005 | Smith et al. |
| 6,985,394 | B2 | 1/2006 | Kim |
| 6,987,693 | B2 | 1/2006 | Cernea et al. |
| 7,020,017 | B2 | 3/2006 | Chen et al. |
| 7,028,170 | B2 | 4/2006 | Saulsbury |
| 7,045,834 | B2 | 5/2006 | Tran et al. |
| 7,054,178 | B1 | 5/2006 | Shiah et al. |
| 7,061,817 | B2 | 6/2006 | Raad et al. |
| 7,079,407 | B1 | 7/2006 | Dimitrelis |
| 7,173,857 | B2 | 2/2007 | Kato et al. |
| 7,187,585 | B2 | 3/2007 | Li et al. |
| 7,196,928 | B2 | 3/2007 | Chen |
| 7,260,565 | B2 | 8/2007 | Lee et al. |
| 7,260,672 | B2 | 8/2007 | Gamey |
| 7,372,715 | B2 | 5/2008 | Han |
| 7,400,532 | B2 | 7/2008 | Aritome |
| 7,406,494 | B2 | 7/2008 | Magee |
| 7,447,720 | B2 | 11/2008 | Beaumont |
| 7,454,451 | B2 | 11/2008 | Beaumont |
| 7,457,181 | B2 | 11/2008 | Lee et al. |
| 7,535,769 | B2 | 5/2009 | Cernea |
| 7,546,438 | B2 | 6/2009 | Chung |
| 7,562,198 | B2 | 7/2009 | Noda et al. |
| 7,574,466 | B2 | 8/2009 | Beaumont |
| 7,602,647 | B2 | 10/2009 | Li et al. |
| 7,663,928 | B2 | 2/2010 | Tsai et al. |
| 7,685,365 | B2 | 3/2010 | Rajwar et al. |
| 7,692,466 | B2 | 4/2010 | Ahmadi |
| 7,752,417 | B2 | 7/2010 | Manczak et al. |
| 7,791,962 | B2 | 9/2010 | Noda et al. |
| 7,796,453 | B2 | 9/2010 | Riho et al. |
| 7,805,587 | B1 | 9/2010 | Van Dyke et al. |
| 7,808,854 | B2 | 10/2010 | Takase |
| 7,827,372 | B2 | 11/2010 | Bink et al. |
| 7,869,273 | B2 | 1/2011 | Lee et al. |
| 7,898,864 | B2 | 3/2011 | Dong |
| 7,924,628 | B2 | 4/2011 | Danon et al. |
| 7,937,535 | B2 | 5/2011 | Ozer et al. |
| 7,957,206 | B2 | 6/2011 | Bauser |
| 7,979,667 | B2 | 7/2011 | Mien et al. |
| 7,996,749 | B2 | 8/2011 | Ding et al. |
| 8,042,082 | B2 | 10/2011 | Solomon |
| 8,045,391 | B2 | 10/2011 | Mokhlesi |
| 8,059,438 | B2 | 11/2011 | Chang et al. |
| 8,095,825 | B2 | 1/2012 | Hirotsu et al. |
| 8,117,462 | B2 | 2/2012 | Snapp et al. |
| 8,164,942 | B2 | 4/2012 | Gebara et al. |
| 8,208,328 | B2 | 6/2012 | Hong |
| 8,213,248 | B2 | 7/2012 | Moon et al. |
| 8,223,568 | B2 | 7/2012 | Seo |
| 8,238,173 | B2 | 8/2012 | Akerib et al. |
| 8,274,841 | B2 | 9/2012 | Shimano et al. |
| 8,279,683 | B2 | 10/2012 | Klein |
| 8,310,884 | B2 | 11/2012 | Iwai et al. |
| 8,332,367 | B2 | 12/2012 | Bhattacherjee et al. |
| 8,339,824 | B2 | 12/2012 | Cooke |
| 8,339,883 | B2 | 12/2012 | Yu et al. |
| 8,347,154 | B2 | 1/2013 | Bahali et al. |
| 8,351,292 | B2 | 1/2013 | Matano |
| 8,356,144 | B2 | 1/2013 | Hessel et al. |
| 8,417,921 | B2 | 4/2013 | Gonion et al. |
| 8,462,532 | B1 | 6/2013 | Argyres |
| 8,484,276 | B2 | 7/2013 | Carlson et al. |
| 8,495,438 | B2 | 7/2013 | Roine |
| 8,503,250 | B2 | 8/2013 | Demone |
| 8,526,239 | B2 | 9/2013 | Kim |
| 8,533,245 | B1 | 9/2013 | Cheung |
| 8,555,037 | B2 | 10/2013 | Gonion |
| 8,599,613 | B2 | 12/2013 | Abiko et al. |
| 8,605,015 | B2 | 12/2013 | Gullag et al. |
| 8,625,376 | B2 | 1/2014 | Jung et al. |
| 8,644,101 | B2 | 2/2014 | Jun et al. |
| 8,650,232 | B2 | 2/2014 | Stortz et al. |
| 8,873,272 | B2 | 10/2014 | Lee |
| 8,964,496 | B2 | 2/2015 | Manning |
| 8,971,124 | B1 | 3/2015 | Manning |
| 9,015,390 | B2 | 4/2015 | Klein |

(56) References Cited

U.S. PATENT DOCUMENTS

| | | | |
|---|---|---|---|
| 9,047,193 B2 | 6/2015 | Lin et al. | |
| 9,165,023 B2 | 10/2015 | Moskovich et al. | |
| 9,436,468 B2* | 9/2016 | Espasa | G06F 9/30036 |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0222879 A1 | 12/2003 | Lin et al. | |
| 2004/0025121 A1* | 2/2004 | Hirose | G06F 9/3885 |
| | | | 712/226 |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0165601 A1 | 7/2008 | Matick et al. | |
| 2008/0178053 A1 | 7/2008 | Gorman et al. | |
| 2008/0215937 A1 | 9/2008 | Dreibelbis et al. | |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1 | 10/2009 | Akerib | |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0223237 A1* | 9/2010 | Mishra | G06F 9/30178 |
| | | | 707/693 |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134226 A1 | 5/2012 | Chow | |
| 2012/0135225 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0185395 A1 | 7/2014 | Seo | |
| 2014/0215185 A1 | 7/2014 | Danielsen | |
| 2014/0250279 A1 | 9/2014 | Manning | |
| 2014/0344934 A1 | 11/2014 | Jorgensen | |
| 2015/0029798 A1 | 1/2015 | Manning | |
| 2015/0042380 A1 | 2/2015 | Manning | |
| 2015/0063052 A1 | 3/2015 | Manning | |
| 2015/0078108 A1 | 3/2015 | Cowles et al. | |
| 2015/0279466 A1 | 3/2015 | Manning | |
| 2015/0120987 A1 | 4/2015 | Wheeler | |
| 2015/0134713 A1 | 5/2015 | Wheeler | |
| 2015/0270015 A1 | 9/2015 | Murphy et al. | |
| 2015/0324290 A1 | 11/2015 | Leidel | |
| 2015/0325272 A1 | 11/2015 | Murphy | |
| 2015/0356009 A1 | 12/2015 | Wheeler et al. | |
| 2015/0356022 A1 | 12/2015 | Leidel et al. | |
| 2015/0357007 A1 | 12/2015 | Manning et al. | |
| 2015/0357008 A1 | 12/2015 | Manning et al. | |
| 2015/0357019 A1 | 12/2015 | Wheeler et al. | |
| 2015/0357020 A1 | 12/2015 | Manning | |
| 2015/0357021 A1 | 12/2015 | Hush | |
| 2015/0357022 A1 | 12/2015 | Hush | |
| 2015/0357023 A1 | 12/2015 | Hush | |
| 2015/0357024 A1 | 12/2015 | Hush et al. | |
| 2015/0357047 A1 | 12/2015 | Tiwari | |
| 2016/0062672 A1 | 3/2016 | Wheeler | |
| 2016/0062673 A1 | 3/2016 | Tiwari | |
| 2016/0062692 A1 | 3/2016 | Finkbeiner et al. | |
| 2016/0062733 A1 | 3/2016 | Tiwari | |
| 2016/0063284 A1 | 3/2016 | Tiwari | |
| 2016/0064045 A1 | 3/2016 | La Fratta | |
| 2016/0064047 A1 | 3/2016 | Tiwari | |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing, pp. 1-14.

(56) References Cited

OTHER PUBLICATIONS

Stojmenovic, "Multiplicative Circulant Networks Topological Properties and Communication Algorithms", Aug. 22, 1997, Discrete Applied Mathematics vol. 77, Issue 3, pp. 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html, pp. 1-5.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, pp. 635-644.
Pagiamtzis, Kostas, "Content-Addressable Memory Introduction", Jun. 25, 2007, (6 pgs.), retrieved from: http://www.pagiamtzis.com/cam/camintro, pp. 1-6.
Pagiamtzis, et al., "Content-Addressable Memory (CAM) Circuits and Architectures: a Tutorial and Survey", Mar. 2006, (16 pgs.), vol. 41, No. 3, IEEE Journal of Solid-State Circuits, pp. 712-727.
International Search Report and Written Opinion for PCT Application No. PCT/US2013/043702, dated Sep. 26, 2013, pp. 1-11.
Elliot, et al., "Computational RAM: Implementing Processors in Memory", Jan.-Mar. 1999, (10 pgs.), vol. 16, Issue 1, IEEE Design and Test of Computers Magazine, pp. 32-41.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures, pp. 1-10.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf., pp. 1-8.
Draper, et al., "The Architecture of the DIVA Processing-in-Memory Chip," Jun. 22-26, 2002, (12 pgs.), ICS '02, retrieved from: http://www.isi.edu/~draper/papers/ics02.pdf., pp. 1-12.
Adibi, et al., "Processing-in-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf., pp. 1-10.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).

* cited by examiner

64 BIT SEED VECTOR — 355

| | 0 | 1 | 2 | 3 | | 4 | 5 | 6 | 7 | | 8 | 9 | 10 | 11 | | 12 | 13 | 14 | 15 | | 16 | 17 | 18 | 19 | | 20 | 21 | 22 | 23 | | 24 | 25 | 26 | 27 | | 28 | 29 | 30 | 31 | | |
|---|---|---|---|---|---|---|---|---|---|---|---|---|---|---|---|---|---|---|---|---|---|---|---|---|---|---|---|---|---|---|---|---|---|---|---|---|---|---|---|---|---|
| | 0 | 1 | 1 | 1 | | 1 | 0 | 0 | 0 | | 0 | 1 | 0 | 0 | | 0 | 0 | 0 | 0 | | 0 | 1 | 1 | 0 | | 0 | 0 | 0 | 0 | | 0 | 1 | 0 | 0 | | 0 | 0 | 0 | 0 | BP—358-1 S1—359 |
| | 32 | 33 | 34 | 35 | | 36 | 37 | 38 | 39 | | 40 | 41 | 42 | 43 | | 44 | 45 | 46 | 47 | | 48 | 49 | 50 | 51 | | 52 | 53 | 54 | 55 | | 56 | 57 | 58 | 59 | | 60 | 61 | 62 | 63 | |
| | 0 | 1 | 1 | 1 | | 0 | 0 | 0 | 0 | | 0 | 1 | 0 | 0 | | 0 | 0 | 0 | 0 | | 0 | 1 | 1 | 0 | | 0 | 0 | 0 | 0 | | 0 | 1 | 0 | 0 | | 0 | 0 | 0 | 0 | BP—358-2 S2—361 |

32 BIT INTERVAL MASK PATTERN — 369

S1 (359):

| | | | | | | | | | | |
|---|---|---|---|---|---|---|---|---|---|---|
| 1 1 1 0 | 0 0 0 1 | 0 0 0 0 | 0 0 0 0 | 0 0 0 1 | 1 0 0 0 | 0 0 0 0 | 1 0 0 0 | 0 0 0 0 | L2 |
| 0 1 0 0 | 0 0 1 1 | 0 0 0 0 | 0 0 0 1 | 0 0 0 0 | 0 0 0 1 | 0 0 0 0 | 0 0 0 1 | 0 0 0 0 | AS |
| 1 1 1 0 | 1 1 1 0 | 1 0 0 0 | 0 0 0 1 | 1 0 0 1 | 1 0 0 1 | 0 0 0 1 | 1 0 0 1 | 0 0 0 1 | L1 |
| 0 0 0 0 | 0 0 0 1 | 0 0 0 0 | 0 0 0 1 | 0 0 0 0 | 0 0 0 1 | 0 0 0 0 | 0 0 0 1 | 0 0 0 0 | NS |
| 1 0 0 0 | 0 0 0 0 | 0 0 0 0 | 0 0 0 0 | 0 0 0 0 | 0 0 0 0 | 0 0 0 0 | 0 0 0 0 | 0 0 0 0 | ANS |

S2 (361):

| | | | | | | | | | | |
|---|---|---|---|---|---|---|---|---|---|---|
| 1 0 1 0 | 0 0 0 1 | 0 0 0 0 | 0 0 0 1 | 0 0 0 1 | 1 0 0 0 | 0 0 0 0 | 0 0 0 0 | 0 0 0 0 | L2 |
| 0 1 0 0 | 0 0 1 0 | 0 0 0 0 | 0 0 0 1 | 0 0 0 0 | 0 0 0 1 | 0 0 0 0 | 0 0 0 1 | 0 0 0 0 | AS |
| 1 1 1 0 | 1 1 1 0 | 1 0 0 0 | 0 0 0 1 | 1 0 0 1 | 1 0 0 1 | 0 0 0 1 | 1 0 0 1 | 0 0 0 1 | L1 |
| 0 0 0 0 | 0 0 0 1 | 0 0 0 0 | 0 0 0 1 | 0 0 0 0 | 0 0 0 1 | 0 0 0 0 | 0 0 0 1 | 0 0 0 0 | NS |
| 1 0 0 0 | 0 0 0 0 | 0 0 0 0 | 0 0 0 0 | 0 0 0 0 | 0 0 0 0 | 0 0 0 0 | 0 0 0 0 | 0 0 0 0 | ANS |

(372)

64 BIT INTERVAL MASK PATTERN — 373

S1 (359):

| | | | | | | | | |
|---|---|---|---|---|---|---|---|---|
| 1 1 0 0 | 0 0 0 0 | 0 0 0 0 | 0 0 0 0 | 0 0 0 0 | 0 0 0 0 | 0 0 0 0 | 0 1 0 0 | L3 |
| 1 0 1 0 | 0 0 1 0 | 0 0 0 0 | 0 0 0 1 | 0 0 0 0 | 0 0 0 0 | 0 0 0 0 | 0 0 0 0 | AS |
| 1 0 0 1 | 0 0 0 0 | 0 0 0 0 | 0 0 0 0 | 0 0 0 0 | 0 0 0 0 | 0 0 0 0 | 0 0 0 0 | L1 |

S2 (361):

| | | | | | | | | |
|---|---|---|---|---|---|---|---|---|
| 1 0 0 0 | 0 0 1 0 | 0 0 0 0 | 0 0 0 0 | 0 0 1 0 | 0 0 0 0 | 0 0 0 0 | 0 0 0 0 | L3 |
| 0 0 0 0 | 0 0 0 0 | 0 0 0 0 | 0 0 0 0 | 0 0 0 0 | 0 0 0 0 | 0 0 0 0 | 0 0 0 0 | AS |
| 0 0 0 0 | 0 0 0 0 | 0 0 0 0 | 0 0 0 0 | 0 0 0 0 | 0 0 0 0 | 0 0 0 0 | 0 0 0 0 | L1 |

(374)

MASK PATTERNS GENERATED IN MEMORY FROM SEED VECTORS

PRIORITY INFORMATION

This application is a Continuation of U.S. application Ser. No. 15/081,551, filed Mar. 25, 2016, which issues as U.S. Pat. No. 10,977,033 on Apr. 13, 2021, the contents of which are included herein by reference.

TECHNICAL FIELD

The present disclosure relates generally to semiconductor memory apparatuses and methods, and more particularly, to apparatuses and methods related to mask patterns generated in memory from seed vectors.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, XOR, NOT, NAND, NOR, and/or XNOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array) to execute instructions. Data can be moved from the memory array to registers external to the memory array via a bus.

BRIEF DESCRIPTION OF THE DRAWINGS

FIGS. 3A and 3B illustrate a table showing the states of data units in sensing circuitry in connection with an example of a seed vector and operations performed thereon in accordance with a number of embodiments of the present disclosure.

DETAILED DESCRIPTION

Figure 1A:
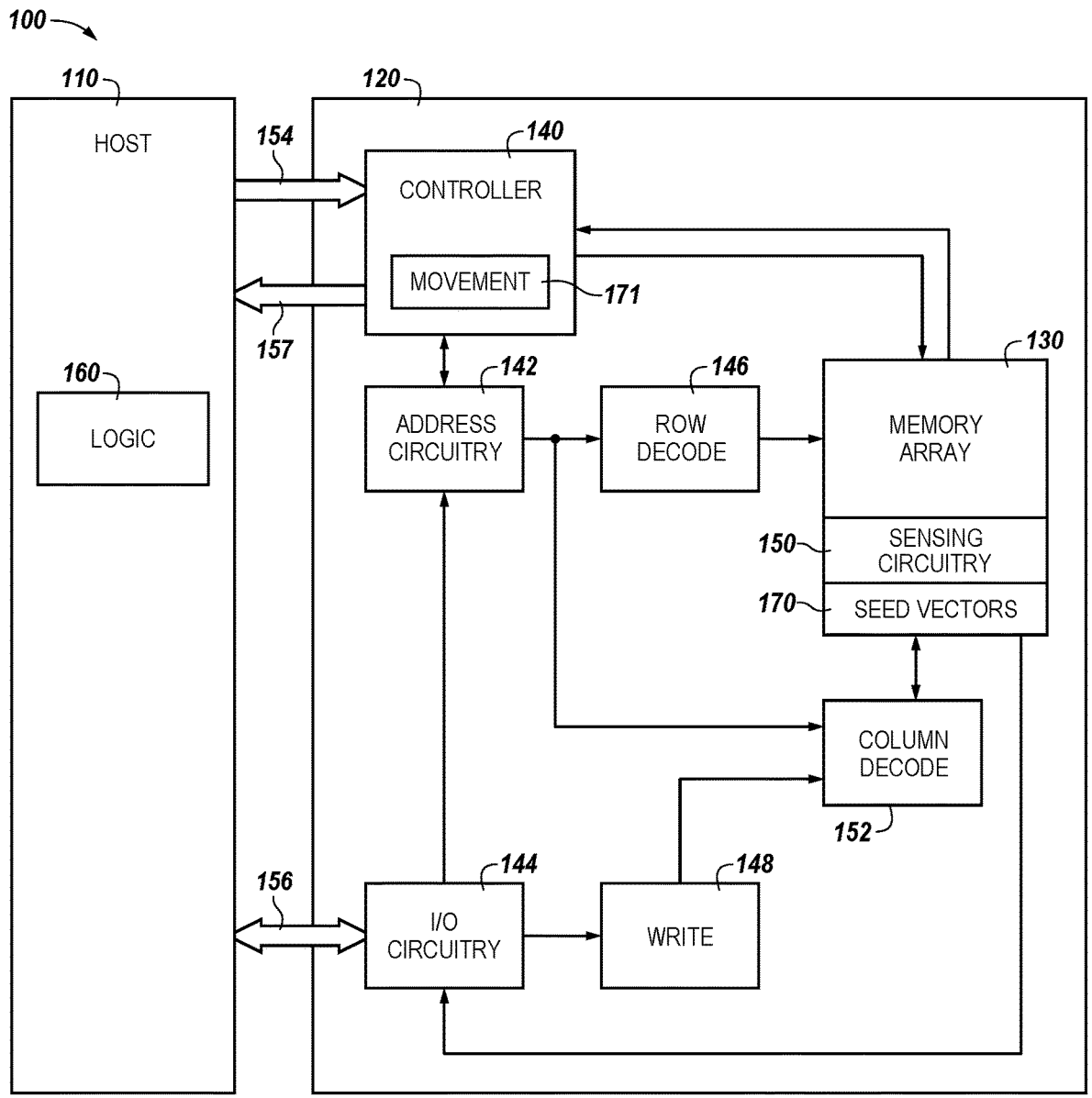
FIG. 1A is a block diagram of an apparatus in the form of a computing system including a memory device in accordance with a number of embodiments of the present disclosure.

The present disclosure includes apparatuses and methods related to mask patterns generated in memory from seed vectors. In at least one embodiment, a mask pattern can be generated by performing operations on a plurality of data units of a seed vector and generating, by performance of the operations, a vector element (e.g., as shown at 384 in FIG. 3A) in the mask pattern. As described herein, the operations to be performed on the plurality of data units of the seed vector can, in various embodiments, include a selected number of logical operations (e.g., Boolean logic) and/or shift operations performed to generate the mask pattern, which also defines the vector element.

A vector element can, in various embodiments, correspond to a plurality of data units (e.g., 0 or 1 in binary coding, although embodiments are not so limited) in sequence that can have various lengths (e.g., bit intervals). A length of a bit interval can be defined by a selected plurality of data units (e.g., bits) in the vector elements of the mask pattern (e.g., selected from predetermined and/or equal lengths of the bit intervals).

A vector element of a mask pattern, as described herein, can define a plurality of data units to be used in performance of each of a plurality of operations on data stored in one or more rows of memory cells. For example, the mask pattern can define a beginning and/or end of each of the operations, as described further herein, to reduce a possibility of continuing performance of an operation into unintended data units in the row.

Vector elements having various bit intervals (e.g., having bit lengths of 8, 16, 32, 64, 128, etc.) can be used to define, for example, a number of sub-operations that may be sequentially performed in each of the plurality of operations on the data stored in the row. The vector element may define how many arithmetical operations (e.g., addition, subtraction, multiplication, and/or division operations, among others), shift operations, and/or logical operations, as described herein, can be sequentially performed on data units in the row to complete performance of the operation (e.g., by the number of data units in each vector element and/or by the number of data units in the row divided by the number of vector elements). For example, the number of data units in a vector element can define how many sequential arithmetical operations are performed on the data units before terminating performance of the sequence of arithmetical operations and/or before reinitiating performance of the arithmetical operations on a next sequence of data units stored in the row. A seed vector, as described herein, can include a continuous series of data units (e.g., a bit string), which may be repeated as iterations to fill a length of the seed vector.

Loading repetitions of a single scalar value (e.g., a vector element) across an entire length of a mask pattern may be expensive (e.g., in time and/or power) because there may be $2^{20}$ data units in a mask pattern that spans columns in a row of a bank of a memory device. A pattern generator device may take around 500-3500 nanoseconds to generate a mask pattern as such. However, sequential arithmetical operations (e.g., addition, etc.), shift operations, and/or logical operations can use at least one such mask pattern per operation. For example, a mask pattern with vector elements, as described herein, can be used to mark one or both ends of each vector element (e.g., with a high bit indicator, as described herein and shown at 385 in FIG. 3A) to prevent improper continuations of operations into the unintended data units stored in the row. Because actual performance of, for example, a 32-bit add operation may take only around 1300 nanoseconds, the overhead expense of mask pattern generation as previously performed may be significant.

As described herein, a seed vector may, in some embodiments, be loaded (e.g., stored) at system boot, program start, and/or at some other time point. The seed vector s can be provided to, received by, and/or at least temporarily stored in a row of an array of memory cells and/or in the sensing circuitry described herein. A number of logical operations and/or shift operations (e.g., various different sequences and/or combinations of the logical operations and/or shift operations) can be selected in order to generate multiple mask patterns from the seed vector s that define multiple vector element lengths (e.g., intervals).

Operations (e.g., a sequence of operations performed by sensing circuitry on data values stored in sequential memory cells of a row) can use a particular mask pattern to define a same length of a vector element, which can, for example, be selected to have 8-bit, 16-bit, 32-bit, or 64-bit intervals, among others, to be used in each operation of a sequence of operations to be performed on data stored in the memory cells. For example, a mask pattern with vector elements may extend a length of a row of memory cells and be used in defining boundaries for the plurality of operations to be performed on data stored in the row. The same seed vector can be repeatedly utilized to generate multiple mask patterns having different interval lengths of vector elements. Hence, generation of mask patterns in memory from seed vectors, as described herein, can increase efficiency and/or reduce the expense of generation of mask patterns for operations.

The mask patterns described herein can, in some embodiments, be generated from a single seed vector by performing the operations described herein. Each of the mask patterns can include a high bit indicator, as described in greater detail in connection with FIGS. 3A and 3B, at, for example, a first data unit of each vector element of a given length (e.g., at a most significant bit position). As described herein, the multiple mask patterns, vector elements having different lengths, and high bit indicators can be generated by performance of various selected sequences of operations initiated on the seed vector.

In the following operations, SHIFT LEFT can represent a shift operation performed on a whole seed vector (e.g., the whole 64-bit seed vector "s" presented below). However, because a mask pattern generated from a seed vector may be applied to a row having, for example, 8K or 16K memory cells, the seed vector may include repetitions to produce the generated length of the mask pattern. When performance of a SHIFT LEFT operation removes a number of data units from a right end of the seed vector s, the vacated data units can be filled in with, for example, a zero data value, in binary notation, at the right end of each SHIFT LEFT repetition on the seed vector s and/or a result of a subsequent operation. In some embodiments, a rotate operation may be performed such that, for example, data units shifted off the left end by each SHIFT LEFT repetition on the seed vector s and/or a result of a subsequent operation may be used to fill in the vacated data units at the right end.

The symbol "a" shown at the left of each operation in the following sequences of operations may represent a received (e.g., at least temporarily stored) number of data units resulting, for example, from input ($\leftarrow$) of the plurality of data units of the seed vectors. The symbol a also can represent a result of an operation performed on a number of data units at least temporarily stored after performance of a preceding operation in the sequence. Among the various selectable operations, an operation may be a SHIFT LEFT 1 operation, as described below, that shifts each of stored data units a of the seed vectors and/or a result of the preceding operation one bit position (BP) to the left.

In some embodiments, each of the data units a can be at least temporarily stored using a compute component of sensing circuitry, as described herein, although the embodiments are not so limited. For example, other locations for storing the data units a are possible, depending on system architecture. Similarly, though one or more seed vectors s may be stored in memory (e.g., memory cells in a number of rows of an array), embodiments are not so limited. For example, the seed vectors s may be at least temporarily stored in locations such as sense amplifiers and/or compute components of the sensing circuitry (e.g., compute components other than those that store the data units a resulting from performance of the operations) to avoid reloading (e.g., moving) the seed vectors s from memory for each operation in which a seed vector s is used.

Other selectable operations may include, as shown below, a Boolean AND logical operation performed on shifted data units a and the original data units of the seed vectors and/or a Boolean AND NOT logical operation performed on shifted data units a and inverted (NOT) data units of the seed vectors. These operations may be performed to generate the mask patterns having vector elements with the particular bit interval lengths and high bit indicator positions shown below.

However, the selectable operations are not limited to those shown below. For example, shift operations may shift data units of the seed vectors and/or a result of a previous operation a any number of BPs to the left and/or right in a sequence of operations (e.g., a SHIFT LEFT 1 operation shifts the data units of the seed vector s and/or a result of a previous operation one BP to the left, whereas a SHIFT LEFT 2 operation shifts the data units two BP to the left, etc.). Moreover, the logical operations are not limited to the shown AND and AND NOT Boolean operations. For example, the selectable logical operations can include the Boolean AND, AND NOT, OR, XOR, INVERT (which, as used herein, is the same as NOT), NAND, NOR, and/or XNOR logical operations in various sequences of operations.

The scope of the present disclosure is not intended to be limited to the sequences of shift and/or logical operations just described. For example, mask patterns may be generated from performance of a single operation, such as a single logical (e.g., Boolean) operation and/or a single shift operation, as described herein or otherwise, on the data units of a seed vector s or a combination of seed vectors and remain within the scope of the present disclosure. In addition, an apparatus for generation of mask patterns in memory from seed vectors may, in various embodiments, be configured to perform only those logical operations and/or shift operations that actually contribute to generating the mask patterns from the seed vectors. For example, such an apparatus may be configured to only perform the AND, AND NOT, and/or shift operations shown in and described in connection with FIGS. 3A and 3B, or whichever operations described herein or otherwise are used for generation of a particular mask pattern or a plurality of mask patterns.

For example, a 64-bit seed vectors (e.g., as shown at 355 in and described in connection with FIGS. 3A and 3B) can be coded in binary notation as: 0111 1000 0100 0000 0110 0000 0100 0000 0111 0000 0100 0000 0110 0000 0100 0000. Binary notation is presented herein in groups of four to make it easier to read, although no separation between the binary data units is intended. The preceding seed vector s can be alternatively coded in hexadecimal notation as 0x7840604070406040. Each data unit in the hexadecimal notation can correspond to the four binary data units in the groups of four. Multiple alternative mask patterns can be selectably generated from this seed vector s. The alternative mask patterns can each have intended bit interval lengths of the vector elements therein, along with a high bit indicator at, for example, the first data unit of each vector element (e.g., at a most significant bit position), by performance of a selected one of various selectable sequences of operations.

For example, as shown in and described in connection with FIG. 3A, a repeating vector element with an 8-bit interval length can be generated by performance of the following operations on the 64-bit seed vector s presented above: a←; a←a SHIFT LEFT 1; a←a AND NOT s. In binary notation, the result of this sequence of operations performed on the 64-bit seed vectors is vector element 1000 0000 (0x80 in hexadecimal) with an 8-bit interval length repeated 8 times and with a high bit indicator (1) appearing, for example, at the first data unit of each of the vector elements. Mask patterns having repeating vector elements with 16-bit, 32-bit, and 64-bit interval lengths also can be generated by performance of particular sequences of operations on the 64-bit seed vector s, as described further in connection with FIGS. 3A and 3B.

The mask patterns with 8, 16, 32, and 64 bit interval lengths can be generated by appropriate operations being performed on a number of seed vectors other than the 64-bit seed vector s just described. For example, other mask pattern lengths and/or other bit interval lengths for the vector elements therein can be generated using seed vectors having various sequence configurations. Vector elements with bit interval lengths greater than 64 bits can be generated by performance of appropriate operations on seed vectors that are longer than the just described 64-bit seed vector s (e.g., seed vectors having 128, 256, etc., data units). The longer seed vectors can be configured with sequences that generate longer vector elements, which also may, by performance of different sequences (e.g., sets) of operations, generate the bit interval lengths just described (e.g., bit interval lengths of 8, 16, 32, 64, 128, and/or 256, etc., may be generated for vector elements, in some embodiments). The vector elements in the generated mask patterns are not limited to the bit interval lengths just presented. For example, vector elements may be generated to be 2 and/or 4 data units long, the vector elements may be an odd number of data units long, the vector elements in the mask pattern may have at least one vector element that differs in length from other vector elements, and/or the lengths of the vector elements may be based on a numeral system other than binary and/or hexadecimal.

Different seed vectors can generate different sets of output mask patterns and/or use different sets of operations to generate them. Accordingly, as described herein, particular seed vectors and/or associated operations can be selected from selectable options for particular operational situations (e.g., differences in the number of data units to be used in each sequential arithmetical operation in a row of memory cells). In addition to using combinations of logical operations and/or shifting operations on a single seed vector, as just described, multiple seed vectors can be combined to generate an intended mask pattern having defined vector element lengths, as described herein.

A number of seed vectors can be formed (e.g., created) and/or stored for use in generating mask patterns. The seed vectors may be entered by a user (e.g., an operator, hardware, firmware, and/or software) to random access memory (RAM), for example. The seed vectors may be stored in RAM and/or read only memory (ROM) for access as mask patterns and/or for use in generating the mask patterns.

In some embodiments, the seed vectors can be created using a computer search protocol. The computer search protocol can be configured to generate intended patterns (e.g., a desired set of patterns) in masks by performance of a number of operations on a plurality of data units of each of the created seed vectors. The results of the computer search protocol may be stored in memory (e.g., RAM and/or ROM, among other memory formats) from which the seed vectors can be accessed. For example, the computer search protocol may be performed and a resultant seed vector may be used as is in generating the mask patterns (e.g., without using a hardware pattern generator, as described herein).

A hardware pattern generator may be used, in some embodiments, individually or in combination with results of the computer search protocol to create the seed vectors and/or to generate the intended patterns in the masks. For example, the results of the computer search protocol may be used by the hardware pattern generator (e.g., at boot-up of a computing device, initiation of a program, etc.). The results of the computer search protocol may be stored in memory (e.g., RAM and/or ROM, among other memory formats) to be accessed and/or used by the hardware pattern generator.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. Because the singular forms "a", "an", and "the" can include both singular and plural referents herein, "a vector element" can, for example, be used to refer to "a plurality of vector elements", unless the context clearly dictates otherwise. As used herein, "a number of" a particular thing can refer to one or more of such things (e.g., performance of a number of operations can refer to performance of one or more operations).

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, data movement component 171, memory array 130, sensing circuitry 150, including sense amplifiers and compute components, and a number of locations to at least temporarily store a number of (e.g., one or more) seed vectors 170 might each also be separately considered a respective "apparatus."

In previous approaches, data may be transferred from the array and sensing circuitry (e.g., via a bus comprising input/output (I/O) lines) to a processing resource such as a processor, microprocessor, and compute engine, which may comprise ALU circuitry and/or other functional unit circuitry configured to perform the appropriate operations. However, transferring data from a memory array and/or sensing circuitry to such processing resource(s) may involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local and/or global I/O lines), moving the data to the array periphery, and providing the data to the compute function.

Furthermore, the circuitry of the processing resource(s) (e.g., a compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and/or memory density, for example.

For example, the sensing circuitry 150 described herein can be formed on a same pitch as a pair of complementary sense lines. As an example, a pair of complementary memory cells may have a cell size with a $6F^2$ pitch (e.g., 3F×2F). If the pitch of a pair of complementary sense lines for the complementary memory cells is 3F, then the sensing circuitry being on pitch indicates the sensing circuitry (e.g., a sense amplifier and corresponding compute component per respective pair of complementary sense lines) is formed to fit within the 3F pitch of the complementary sense lines.

Furthermore, the circuitry of the processing resource(s) (e.g., a compute engine, such as an ALU) of various prior systems may not conform to pitch rules associated with a memory array. For example, the memory cells of a memory array may have a $4F^2$ or $6F^2$ cell size. As such, the devices (e.g., logic gates) associated with ALU circuitry of previous systems may not be capable of being formed on pitch with the memory cells (e.g., on a same pitch as the sense lines), which can affect chip size and/or memory density, for example. In the context of some computing systems and subsystems (e.g., a central processing unit (CPU)), data may be processed in a location that is not on pitch and/or on chip with memory (e.g., memory cells in the array), as described herein. The data may be processed by a processing resource associated with a host, for instance, rather than on pitch with the memory.

In contrast, a number of embodiments of the present disclosure can include the sensing circuitry 150 (e.g., including sense amplifiers and/or compute components) being formed on pitch with the memory cells of the array. The sensing circuitry 150 can be configured for (e.g., capable of) performing compute functions (e.g., logical operations).

PIM capable device operations can use bit vector based operations. As used herein, the term "bit vector" is intended to mean a number of bits on a bit vector memory device (e.g., a PIM device) stored in a row of an array of memory cells and/or in sensing circuitry. Thus, as used herein a "bit vector operation" is intended to mean an operation that is performed on a bit vector that is a portion of virtual address space and/or physical address space (e.g., used by a PIM device). In some embodiments, the bit vector may be a physically contiguous number of bits on the bit vector memory device stored physically contiguous in a row and/or in the sensing circuitry such that the bit vector operation is performed on a bit vector that is a contiguous portion of the virtual address space and/or physical address space. For example, a row of virtual address space in the PIM device may have a bit length of 16K bits (e.g., corresponding to 16K complementary pairs of memory cells in a DRAM configuration). Sensing circuitry 150, as described herein, for such a 16K bit row may include a corresponding 16K processing elements (e.g., compute components, as described herein) formed on pitch with the sense lines selectably coupled to corresponding memory cells in the 16 bit row. A compute component in the PIM device may operate as a one bit processing element on a single bit of the bit vector of the row of memory cells sensed by the sensing circuitry 150 (e.g., sensed by and/or stored in a sense amplifier paired with the compute component, as described herein).

A number of embodiments of the present disclosure include sensing circuitry formed on pitch with memory cells of a row and selectably coupled to the memory cells of the row of an array of memory cells. The sensing circuitry may be capable of performing data sensing and/or compute functions and storing data (e.g., caching by at least temporarily storing) local to the array of memory cells.

In order to appreciate generating the mask patterns in memory from seed vectors by performance of the operation described herein, a discussion of an apparatus for implementing such techniques (e.g., a memory device having PIM capabilities and an associated host) follows. According to various embodiments, program instructions (e.g., PIM commands) involving a memory device having PIM capabilities can distribute implementation of the PIM commands and data over multiple sensing circuitries that can implement operations and/or can move and store the PIM commands and data within the memory array (e.g., without having to transfer such back and forth over an address and control (A/C) and data bus between a host and the memory device). Thus, data for a memory device having PIM capabilities can be accessed and used in less time and/or using less power. For example, a time and/or power advantage can be realized by increasing the speed, rate, and/or efficiency of data being moved around and stored in a computing system in order to process requested memory array operations (e.g., reads, writes, shifts, logical operations, etc.).

The system 100 illustrated in FIG. 1A can include a host 110 coupled (e.g., connected) to memory device 120, which includes the memory array 130. Host 110 can be a host system such as a personal laptop computer, a desktop computer, a tablet computer, a digital camera, a smart phone, and/or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for example, a server system and/or a high performance computing (HPC) system and/or a portion thereof. Although the example shown in FIG. 1A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and/or NOR flash array, for example. The memory array 130 can include memory cells arranged in rows coupled by access lines (which may be referred to herein as word lines or select lines) and columns coupled by sense lines (which may be referred to herein as digit lines or data lines). Although a single memory array 130 is shown in FIG. 1A, embodiments are not so limited. For example, memory device 120 may include a number of memory arrays 130 (e.g., a number of banks of DRAM cells, NAND flash cells, etc.) in addition to a number of subarrays, as described herein.

The memory device 120 can include address circuitry 142 to latch address signals provided over a data bus 156 (e.g., an I/O bus from the host 110) by I/O circuitry 144 (e.g., provided to external ALU circuitry and to DRAM data lines (DQs) via local I/O lines and global I/O lines). As used herein, DRAM DQs can enable input of data to and/or output of data from a bank (e.g., from and to the controller 140 and/or host 110) via a bus (e.g., data bus 156). During a write operation, voltage and/or current variations, for example, can be applied to a DQ (e.g., a pin). These variations can be translated into an appropriate signal and stored in a selected memory cell. During a read operation, a data unit read from a selected memory cell can appear at the DQ once access is complete and the output is enabled. At other times, DQs can be in a state such that the DQs do not source or sink current and do not present a signal to the system. This also may reduce DQ contention when two or more devices (e.g., banks) share the data bus, as described herein.

Status and exception information can be provided from the controller 140 on the memory device 120 to a host 110, for example, through a high speed interface (HSI) out-of-band bus 157. The host 110 can include a logic component 160 to allocate a plurality of locations (e.g., controllers for subarrays) in the arrays of each respective bank to store bank commands, application instructions (e.g., as sequences of operations), and arguments (PIM commands) for the various banks associated with operation of each of a plurality of memory devices (e.g., 120-0, 120-1, . . . , 120-N). The host 110 can dispatch commands (e.g., PIM commands) to the plurality of memory devices 120-1, . . . , 120-N to store those program instructions within a given bank of a memory device. In some embodiments, program instructions, for example, relating to mask patterns generated in memory from seed vectors, may originally be stored within a given bank of a memory device (e.g., in a memory array 130) and/or may be provided to a controller 140 for the given bank independent of the host 110.

Address signals are received through address circuitry 142 and decoded by a row decoder 146 and a column decoder 152 to access the memory array 130. Data can be sensed (read) from memory array 130 by sensing voltage and/or current changes on sense lines (digit lines) using a number of sense amplifiers, as described herein, of the sensing circuitry 150. A sense amplifier can read and latch a page (e.g., a row) of data from the memory array 130. Additional compute components, as described herein, can be coupled to the sense amplifiers and can be used in combination with the sense amplifiers to sense, store (e.g., cache and/or buffer), perform compute functions (e.g., operations), and/or move data. The I/O circuitry 144 can be used for bi-directional data communication with host 110 over the data bus 156 (e.g., a 64 bit wide data bus). The write circuitry 148 can be used to write data to the memory array 130.

Controller 140 (e.g., bank control logic and sequencer) can decode signals (e.g., commands) provided by control bus 154 from the host 110. These signals can include chip enable signals, write enable signals, and address latch signals that can be used to control operations performed on the memory array 130, including data sense, data store, data movement, data write, and data erase operations, among other operations. In various embodiments, the controller 140 can be responsible for executing instructions from the host 110 and accessing the memory array 130. The controller 140 can be a state machine, a sequencer, or some other type of controller. The controller 140 can control shifting data (e.g., right or left) in a row of an array (e.g., memory array 130) and/or performing logical operations thereon, as described in connection with FIGS. 2A-2C.

Examples of the sensing circuitry 150 are described further below (e.g., in connection with FIGS. 1B and 2A-2C). For example, in a number of embodiments, the sensing circuitry 150 can include a number of sense amplifiers and a number of compute components, which may serve as an accumulator and can be used to perform operations as directed by a controller 140 and/or a respective subarray controller (not shown) of each subarray (e.g., on data associated with complementary sense lines).

In a number of embodiments, the sensing circuitry 150 can be used to perform operations using data stored in memory array 130 as inputs and/or to participate in movement of the data for transfer, writing, logic, and storage operations to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and/or other processing circuitry, such as ALU circuitry, located on device 120, such as on controller 140 or elsewhere).

In various previous approaches, data associated with an operand, for example, would be read from memory via sensing circuitry 150 and provided to external ALU circuitry via I/O lines (e.g., via local I/O lines and/or global I/O lines). The external ALU circuitry could include a number of registers and would perform compute functions using the operands, and the result would be transferred back to the array via the I/O lines.

In contrast, in a number of embodiments of the present disclosure, sensing circuitry 150 is configured to perform operations on data stored in memory array 130 and store the result back to the memory array 130 without enabling a local I/O line and/or global I/O line coupled to the sensing circuitry 150. The sensing circuitry 150 can be formed on pitch with the memory cells of the array. Additionally, one or more locations of seed vectors 170 can be coupled to the controller 140. For example, seed vectors 170 may be stored in memory cells of the array 130 and/or in memory (e.g., read only memory) associated with the sensing circuitry 150, among other possible locations accessible to the controller 140. The controller 140, sensing circuitry 150, and the seed vectors 170 can cooperate in performing operations related to mask patterns generated in memory from the seed vectors, according to embodiments described herein.

As such, in a number of embodiments, circuitry external to memory array 130 and sensing circuitry 150 is not needed to perform compute functions, as the sensing circuitry 150 can perform the appropriate operations in order to perform such compute functions in a sequence of instructions without the use of an external processing resource. Therefore, the sensing circuitry 150 may be used to complement or to replace, at least to some extent, such an external processing resource (or at least reduce the bandwidth consumption of transfer of data to and/or from such an external processing resource).

In a number of embodiments, the sensing circuitry 150 may be used to perform operations (e.g., to execute a sequence of instructions) in addition to operations performed by an external processing resource (e.g., host 110). For example, either of the host 110 and the sensing circuitry 150 may be limited to performing only certain operations and/or a certain number of operations.

Enabling a local I/O line and/or global I/O line can include enabling (e.g., turning on, activating) a transistor having a gate coupled to a decode signal (e.g., a column decode signal) and a source/drain coupled to the I/O line. However, embodiments are not limited to not enabling a local I/O line and/or global I/O line. For example, in a number of embodiments, the sensing circuitry 150 can be used to perform operations without enabling column decode lines of the array. However, the local I/O line(s) and/or global I/O line(s) may be enabled in order to transfer a result to a suitable location other than back to the memory array 130 (e.g., to an external register).

Figure 1B:
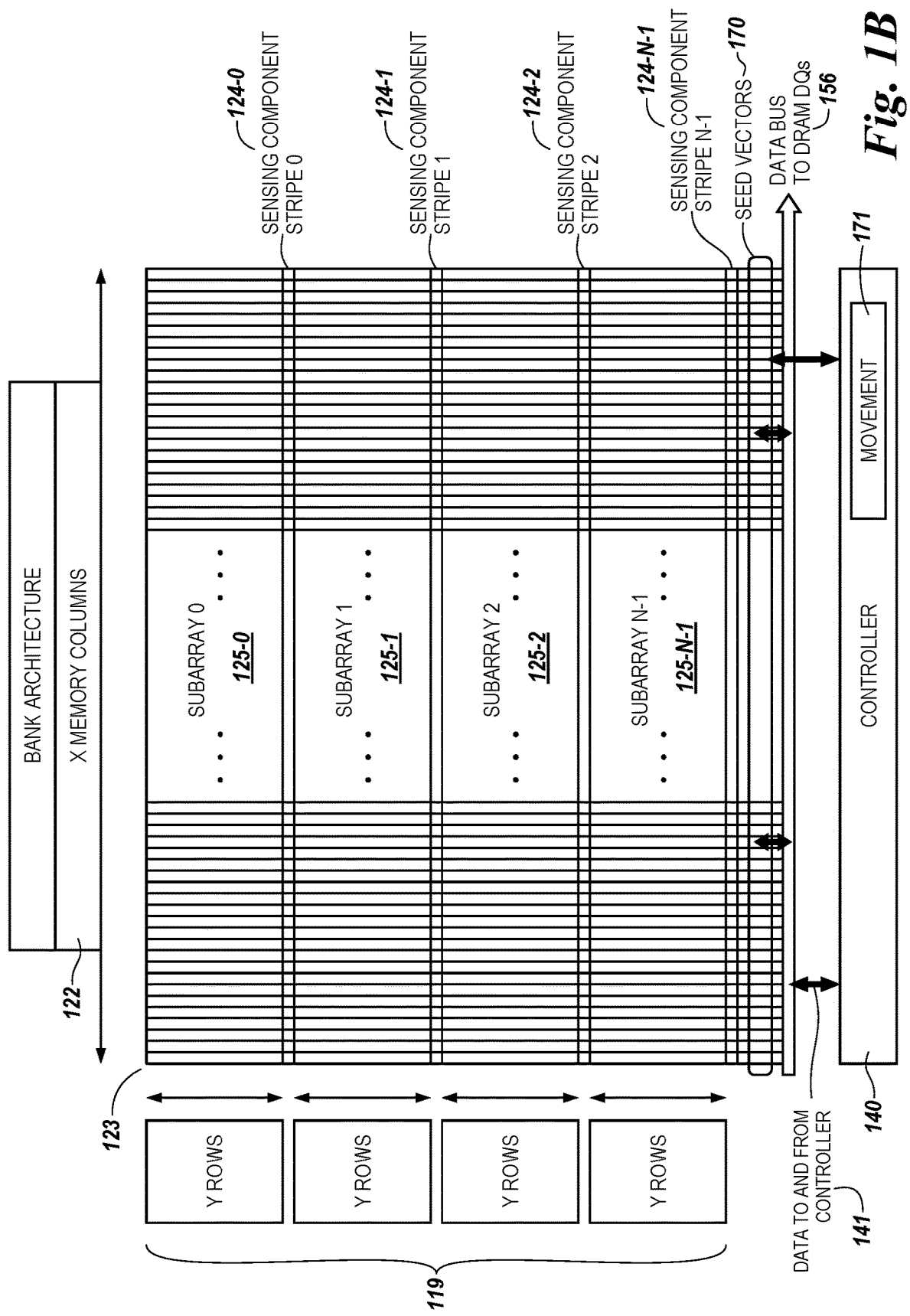
FIG. 1B is a block diagram of a bank section of a memory device in accordance with a number of embodiments of the present disclosure.

FIG. 1B is a block diagram of a bank section 123 of a memory device in accordance with a number of embodiments of the present disclosure. For example, bank section 123 can represent an example section of a number of bank sections of a bank of a memory device (e.g., bank section 0, bank section 1, . . . , bank section M−1). As shown in FIG. 1B, a bank section 123 can include a plurality of memory columns 122 shown horizontally as X (e.g., 4096, 8192, or 16,384 columns, among various possibilities, in an example DRAM bank and bank section). Additionally, the bank section 123 may be divided into subarray 0, subarray 1, . . . , and subarray N−1 (e.g., 32, 64, or 128 subarrays, among various possibilities) shown at 125-0, 125-1, . . . , 125-N−1, respectively, that are separated by amplification regions configured to be coupled to a data path. As such, the subarrays 125-0, 125-1, . . . , 125-N−1 can each have amplification regions 124-0, 124-1, . . . , 124-N−1 that correspond to sensing component stripe 0, sensing component stripe 1, . . . , and sensing component stripe N−1, respectively.

Each column 122 is configured to be coupled to sensing circuitry 150, as described in connection with FIG. 1A and elsewhere herein. As such, each column in a subarray can be coupled individually to a sense amplifier that contributes to a sensing component stripe for that subarray. For example, as shown in FIG. 1B, the bank section 123 can include sensing component stripe 0, sensing component stripe 1, . . . , sensing component stripe N−1 that each have sensing circuitry 150 with sense amplifiers that can, in various embodiments, be used as registers, cache and/or data buffering and that are coupled to each column 122 in the subarrays 125-0, 125-1, . . . , 125-N−1.

Each of the of the subarrays 125-0, 125-1, . . . , 125-N−1 can include a plurality of rows 119 shown vertically as Y (e.g., each subarray may include 256, 512, 1024 rows, among various possibilities, in an example DRAM bank). Example embodiments are not limited to the example horizontal and vertical orientation of columns and rows described herein or the example numbers thereof.

The location(s) of the seed vectors 170 associated with controller 140, the sensing circuitry 150, and/or the memory array 130, as shown in FIG. 1A, can be connected (e.g., selectably coupled) to the data movement components 171 associated with the controller 140. The data units of the seed vectors can be moved, for example, from corresponding memory cells in the array 130 to sense amplifiers and/or compute components of the sensing circuitry 150 and/or between various sense amplifiers and/or compute components in different portions of the sensing circuitry 150, as directed by the data movement component 171, for performance of the operations described herein. In some embodiments, seed vectors may be input to the controller 140 from the host 110 via the data bus 156 and/or the data movement component 171 associated with the controller can direct movement of the seed vectors to the location(s) of the seed vectors 170.

For example, the portions of the sensing circuitry 150 can be separated between a number of sensing component stripes 124 that are each physically associated with a subarray 125 of memory cells in a bank section 123, as shown in FIG. 1B. The sense amplifiers that may sense data units in memory cells of the subarrays and/or that may cache input data units (e.g., from a seed vector and/or a result of an operation) and the compute components that may perform compute operations on the same or other latched data units may be located in a plurality of sensing component stripes 124. The plurality of sensing component stripes 124 may each be physically associated with a subarray 125 of memory cells in the bank section 123, as shown in FIG. 1B.

As shown in FIG. 1B, the bank section 123 can be associated with controller 140. The controller 140 shown in FIG. 1B can, in various examples, represent at least a portion of the functionality embodied by and contained in the controller 140 shown in FIG. 1A. The controller 140 can direct (e.g., control) input of commands and data 141 to the section 123 and/or output (e.g., movement) of data from the bank section 123 (e.g., to the host 110) along with control of data movement in the section 123 by the data movement component 171, as described herein. The bank section 123 can include the data bus 156 (e.g., a 64 bit wide data bus) to DRAM DQs, which can correspond to the data bus 156 described in connection with FIG. 1A. Each data bus 156 for each bank of subarrays (e.g., 125-0, 125-1, . . . , 125-N-1) can be referred to as a portion of a data bus that contributes to formation of a combined data bus (e.g., for a plurality of banks and/or memory devices). As such, in some embodiments, eight 64 bit wide data bus portions for eight banks can contribute to a 512 bit wide combined data bus.

Figure 2A:
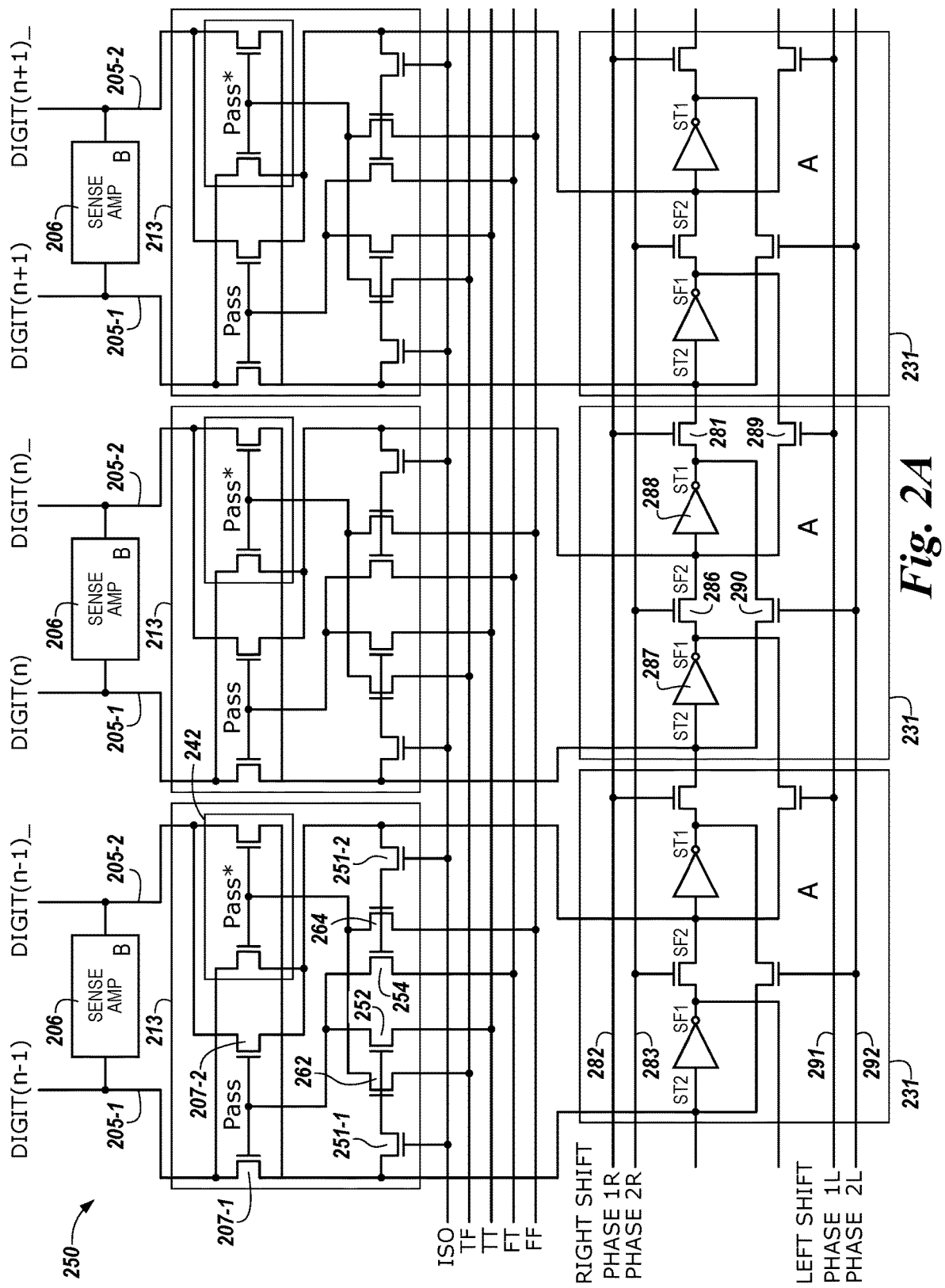
FIGS. 2A and 2B are schematic diagrams illustrating sensing circuitry in accordance with a number of embodiments of the present disclosure.

FIG. 2A is a schematic diagram illustrating sensing circuitry 250 capable of implementing a number of logical operations and/or shift operations in accordance with a number of embodiments of the present disclosure. FIG. 2A shows a number of sense amplifiers 206 coupled to respective pairs of complementary sense lines 205-1 and 205-2, and a corresponding number of compute components 231 coupled to the sense amplifiers 206 via pass gates 207-1 and 207-2. The sense amplifiers 206 and compute components 231 shown in FIG. 2A can correspond to sensing circuitry 150 shown in FIG. 1A and/or the sensing circuitry 250 associated with the plurality of sensing component stripes 124 shown in FIG. 1B, for example. The sensing circuitry 250 shown in FIG. 2A includes logical operation selection logic 213, which can be operated as described further below.

Although not shown, memory cells are coupled to the pairs of complementary sense lines 205-1 and 205-2 (e.g., columns). For example, a memory cell can comprise a transistor and a capacitor. The memory cells can be, for example, 1T1C DRAM cells each comprising a storage element (e.g., capacitor) and an access device (e.g., transistor), although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell may be refreshed after being read). The cells of the memory array can be arranged in rows coupled by word lines and columns coupled by pairs of complementary data lines DIGIT(n-1)/DIGIT(n-1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pairs of complementary data lines (e.g., three columns) are shown in FIG. 2A, embodiments of the present disclosure are not so limited. For example, an array of memory cells can include additional columns of memory cells and/or data lines (e.g., 4,096, 8,192, 16,384, etc.).

Memory cells can be coupled to different data lines and/or word lines. For example, a first source/drain region of an access transistor of a memory cell can be coupled to a data line 205-1 (D), a second source/drain region of the access transistor of the memory cell can be coupled to a capacitor of the memory cell, and a gate of the access transistor of the memory cell can be coupled to a word line of the memory array.

As shown in FIG. 2A, the sensing circuitry 250 can comprise a sense amplifier 206, a compute component 231, and logical operation selection logic 213 corresponding to respective columns of memory cells (e.g., coupled to respective pairs of complementary data lines). The sense amplifier 206 can comprise, for example, a cross coupled latch, which can be referred to herein as a primary latch. The sense amplifiers 206 can be configured, for example, as described with respect to FIG. 2B.

In the example illustrated in FIG. 2A, the circuitry corresponding to compute components 231 is configured as a loadable shift register. For example, each compute component 231 comprises a latch, which may be referred to herein as a secondary latch, and an additional number of transistors operable to transfer (e.g., shift) data units right and/or left (e.g., to a latch of an adjacent compute component 231). In a number of embodiments, the latch of the compute component 231 can serve as an accumulator. As such, the compute component 231 can operate as and/or may be referred to herein as an accumulator.

The gates of the pass gates 207-1 and 207-2 can be controlled by a logical operation selection logic signal, Pass. For example, an output of the logical operation selection logic 213 can be coupled to the gates of the pass gates 207-1 and 207-2, as shown in FIG. 2A.

The sensing circuitry 250 illustrated in FIG. 2A also shows logical operation selection logic 213 coupled to a number of logic selection control input control lines, including ISO, TF, TT, FT, and FF. Selection of a logical operation from a plurality of logical operations is determined from the condition of logic selection control signals on the logic selection control input control lines, as well as the data units present on the pairs of complementary sense lines 205-1 and 205-2 when the isolation transistors (e.g., 251-1 and 251-2) are enabled via an ISO control signal being activated.

In various embodiments, the logical operation selection logic 213 can include four logic selection transistors: logic selection transistor 262 coupled between the gates of the swap transistors 242 and a TF signal control line, logic selection transistor 252 coupled between the gates of the pass gates 207-1 and 207-2 and a TT signal control line, logic selection transistor 254 coupled between the gates of the pass gates 207-1 and 207-2 and a FT signal control line, and logic selection transistor 264 coupled between the gates of the swap transistors 242 and a FF signal control line. Gates of logic selection transistors 262 and 252 are coupled to the true sense line through isolation transistor 251-1 (having a gate coupled to an ISO signal control line). Gates of logic selection transistors 264 and 254 are coupled to the complementary sense line through isolation transistor 251-2 (also having a gate coupled to an ISO signal control line).

Data units present on the pair of complementary sense lines 205-1 and 205-2 can be loaded into the compute component 231 via the pass gates 207-1 and 207-2. When the pass gates 207-1 and 207-2 are OPEN, data units on the pair of complementary sense lines 205-1 and 205-2 are passed to the compute component 231 and thereby loaded into the loadable shift register. The data unit on the pair of complementary sense lines 205-1 and 205-2 can be the data unit stored at least temporarily in the sense amplifier 206 when the sense amplifier is enabled (e.g., fired). The logical operation selection logic signal, Pass, is activated to OPEN (e.g., turn on) the pass gates 207-1 and 207-2.

The ISO, TF, TT, FT, and FF control signals can operate to select a logical operation to implement based on the data unit ("B") in the sense amplifier 206 and the data unit ("A") in the compute component 231 (e.g., as used herein, the data unit stored in a latch of a sense amplifier is referred to as a "B" data unit, and the data unit stored in a latch of a compute component is referred to as an "A" data unit). In particular, the ISO, TF, TT, FT, and FF control signals are configured to select the logical operation (e.g., function) to implement independent from the data unit present on the pair of complementary sense lines 205-1 and 205-2 (although the result of the implemented logical operation can be dependent on the data unit present on the pair of complementary sense lines 205-1 and 205-2). For example, the ISO, TF, TT, FT, and FF control signals can select the logical operation to implement directly because the data unit present on the pair of complementary sense lines 205-1 and 205-2 is not passed through logic to operate the gates of the pass gates 207-1 and 207-2.

Additionally, FIG. 2A shows swap transistors 242 configured to swap the orientation of the pair of complementary sense lines 205-1 and 205-2 between the sense amplifier 206 and the compute component 231. For example, when the swap transistors 242 are OPEN (e.g., turned on), data units on the pair of complementary sense lines 205-1 and 205-2 on the sense amplifier 206 side of the swap transistors 242 are oppositely-coupled to the pair of complementary sense lines 205-1 and 205-2 on the compute component 231 side of the swap transistors 242, and thereby loaded into the loadable shift register of the compute component 231 in a complementary manner.

As an example, the logical operation selection logic signal Pass can be activated (e.g., high) to OPEN (e.g., turn on) the pass gates 207-1 and 207-2 when the ISO control signal line is activated and either the TT control signal is activated (e.g., high) with the data unit on the true sense line being "1" or the FT control signal is activated (e.g., high) with the data unit on the complement sense line being "1."

The data unit on the true sense line being a "1" OPENs logic selection transistors 252 and 262. The data unit on the complementary sense line being a "1" OPENs logic selection transistors 254 and 264. If the ISO control signal or either the respective TT/FT control signal or the data unit on the corresponding sense line (e.g., sense line to which the gate of the particular logic selection transistor is coupled) is not high, then the pass gates 207-1 and 207-2 will not be OPENed by a particular logic selection transistor.

The logical operation selection logic signal Pass* can be activated (e.g., high) to OPEN (e.g., turn on) the swap transistors 242 when the ISO control signal line is activated and either the TF control signal is activated (e.g., high) with data unit on the true sense line being "1," or the FF control signal is activated (e.g., high) with the data unit on the complement sense line being "1." If either the respective control signal or the data unit on the corresponding sense line (e.g., sense line to which the gate of the particular logic selection transistor is coupled) is not high, then the swap transistors 242 will not be OPENed by a particular logic selection transistor.

The sensing circuitry 250 illustrated in FIG. 2A is configured to select one of a plurality of logical operations to implement directly from the four logic selection control signals (e.g., logical operation selection is not dependent on the data unit present on the pair of complementary sense lines). Some combinations of the logic selection control signals can cause both the pass gates 207-1 and 207-2 and swap transistors 242 to be OPEN (e.g., conducting) at the same time, which shorts the pair of complementary sense lines 205-1 and 205-2 together. According to a number of embodiments of the present disclosure, the logical operations which can be implemented by the sensing circuitry 250 illustrated in FIG. 2A can be the logical operations summarized in the logic tables shown in FIG. 2C.

Although not shown in FIG. 2A, each column of memory cells can be coupled to a column decode line that can be activated to transfer, via a local I/O line, a data unit from a corresponding sense amplifier 206 and/or compute component 231 to a control component external to the array such as an external processing resource (e.g., host processor and/or other functional unit circuitry). The column decode line can be coupled to a column decoder (e.g., column decoder 152 in FIG. 1A). However, as described herein, in a number of embodiments, data need not be transferred via such I/O lines to perform logical operations in accordance with embodiments of the present disclosure. In a number of embodiments, shift circuitry can be operated in conjunction with sense amplifiers 206 and compute components 231 to perform shift operations without transferring data to a control component external to the array, for example. As used herein, transferring data, which may also be referred to as moving data is an inclusive term that can include, for example, copying data from a source location to a destination location and/or moving data from a source location to a destination location without necessarily maintaining a copy of the data at the source location.

As noted above, the compute components 231 can comprise a loadable shift register. In this example, each compute component 231 is coupled to a corresponding pair of complementary data lines 205-1/205-2, with a node ST2 being coupled to the particular data line (e.g., DIGIT(n)) communicating a "true" data unit and with node SF2 being coupled to the corresponding complementary data line (e.g., DIGIT(n)_) communicating the complementary data unit (e.g., "false" data unit).

In this example, the loadable shift register comprises a first right-shift transistor 281 of a particular compute component 231 having a gate coupled to a first right-shift control line 282 (e.g., PHASE 1R), and a second right-shift transistor 286 of the particular compute component 231 having a gate coupled to a second right-shift control line 283 (e.g., PHASE 2R). Node ST2 of the particular control component is coupled to an input of a first inverter 287, whose output (e.g., node SF1) is coupled to a first source/drain region of transistor 286. The second source/drain region of transistor 286 is coupled to the input (e.g., node SF2) of a second inverter 288. The output (e.g., node ST1) of inverter 288 is coupled to a first source/drain region of transistor 281, and a second source/drain region of transistor 281 the particular compute component 231 is coupled to an input (e.g., node ST2) of a first inverter 287 of an adjacent compute component 231. The loadable shift register shown in FIG. 2A includes a first left-shift transistor 289 coupled between node SF2 of a particular compute component and node SF1 of an adjacent compute component 231. The loadable shift register shown in FIG. 2A also includes a second left-shift transistor 290 of a particular compute component 231 having a first source/drain region coupled to node ST2 and a second source/drain region coupled to node ST1. The gate of the first left-shift transistor 289 is coupled to a first left-shift control line 291 (e.g., PHASE 1L), and the gate of the second left-shift transistor 290 is coupled to a second left-shift control line 492 (e.g., PHASE 2L).

In operation, a data unit on a pair of complementary data lines (e.g., 205-1/205-2) can be loaded into a corresponding compute component 231 (e.g., by operating logical operation selection logic as described above). As an example, a data unit can be loaded into a compute component 231 via overwriting of the data unit currently stored in the compute component 231 with the data unit stored in the corresponding sense amplifier 206. Alternatively, a data unit may be loaded into a compute component by deactivating the control lines 282, 283, 291, and 292.

Once a data unit is loaded into a compute component 231, the "true" data unit is separated from the complement data unit by the first inverter 287. Shifting data to the right (e.g., to an adjacent compute component 231) can include alternating operation of the first right-shift transistor 281 and the second right-shift transistor 286, for example, via the PHASE 1R and PHASE 2R control signals being periodic signals that go high out of phase from one another (e.g., non-overlapping alternating square waves 180 out of phase). The transistor 290 can be turned on to latch the shifted data unit.

An example of shifting data left via the shift register shown in FIG. 2A can include operating control signals 291 and 292 to move a data unit one control component to the left through transistors 289 and 290. Data from node ST2 is inverted through inverter 287 to node SF1. Activation of control signal 291 causes the data from node SF1 to move left through transistor 289 to node SF2 of a left-adjacent compute component 231. Data from node SF2 is inverted through inverter 288 to node ST1. Subsequent activation of control signal 292 causes the data from node ST1 to move through transistor 290 left to node ST2, which completes a left shift by one compute component 231. Data can be "bubbled" to the left by repeating the left shift sequence multiple times. Data units can be latched (and prevented from being further shifted) by maintaining the control signal 292 activated.

Embodiments of the present disclosure are not limited to the shifting capability described in association with the compute components 231. For example, a number of embodiments can include shift circuitry in addition to and/or instead of the shift circuitry described in association with a loadable shift register.

The sensing circuitry 250 in FIG. 2A can be operated in several modes to perform logical operations, including a first mode in which a result of the logical operation is initially stored in the sense amplifier 206, and a second mode in which a result of the logical operation is initially stored in the compute component 231. Additionally with respect to the first operating mode, sensing circuitry 250 can be operated in both pre-sensing (e.g., sense amplifiers fired before logical operation control signal active) and post-sensing (e.g., sense amplifiers fired after logical operation control signal active) modes with a result of a logical operation being initially stored in the sense amplifier 206.

In a number of examples, the sense amplifier 206 and the compute component 231 can be in at least one of two states associated with the first mode and the second mode. As used herein, a state of a sense amplifier 206 and/or the compute component 231 can describe a transfer of data between the sense amplifier 206 and/or the compute component 231. The state of the sense amplifier 206 and/or the compute component 231 can also be described as whether the sense amplifier 206 and/or the compute component 231 is in an equilibration state or is storing a data unit (e.g., a binary 0 or 1 data value). For example, a sense amplifier can be configured to be in an initial state, wherein the initial state is one of an equilibration state and a data storage state.

A data storage state can include the sense amplifiers 206 storing a data unit. As used herein, a data unit can be referred to as a bit and/or a digit value. Data can be transferred from a compute component 231 to a sense amplifier 206 in response to enabling a pass gate (e.g., activating the PASS and/or PASS* control signals via the TF 262, TT 252, FT 254, and/or FF 264 control signals that are referred to herein as a logical operation selection logic) and the sense amplifier 206 being in a equilibration state. Data can be transferred from a sense amplifier 206 to a compute component 231 in response to enabling the pass gate (e.g., activating the PASS and/or PASS* control signals via the TF 262, TT 252, FT 254, and/or FF 264 control signals that are referred to herein as a logical operation selection logic) and the sense amplifier 206 being in a data storage state. The direction of the transfer of data between the sense amplifier 206 and the compute component 231 is determined by whether the sense amplifier 206 is in an equilibration state or stores a data unit before the PASS and/or PASS* control signals are activated and by a particular operation selected via the logical operation selection logic (e.g., TF 262, TT 252, FT 254, and FF 264 control signals).

For example, if the sense amplifier 206 is equilibrated and the PASS and/or PASS* control signals are activated to provide a conduction path (e.g., electrical continuity) between the sense amplifier 206 and the compute component 231, then a data unit stored in the compute component 231 can be transferred from the compute component 231 to the sense amplifier 206.

If the sense amplifier 206 is configured to store a first bit (e.g., first data unit) and the PASS and/or PASS* control signals are activated to provide a conduction path between the sense amplifier 206 and the compute component 231, then a second bit (e.g., second data unit) that is stored in the compute component 231 before the activation of the PASS and/or PASS* control signals can be replaced by the first bit and the sense amplifier 206 retains the first bit. Furthermore, a number of operations can be performed using the first bit and the second bit using the logical operation selection logic and the result of the operation can be stored in the compute component 231.

Using an equilibration signal to direct the transfer of data between the sense amplifier 206 and the compute component 231 can provide the ability to selectively perform an operation in sense amplifiers that are not equilibrated without performing the operation in sense amplifiers that are equilibrated. For example, a PASS and/or a PASS* control signal can be activated in a plurality of sensing components to move data between a first group of a plurality of sense amplifiers that are equilibrated and a first group of a plurality of compute components. The PASS and/or PASS* control signals can also be activated to move data between a second group of the plurality of sense amplifiers and a second group of the plurality of component components that are not equilibrated to selectively perform an operation in a second group of sense components while not performing the operation on a first group of sense components.

Figure 2B:
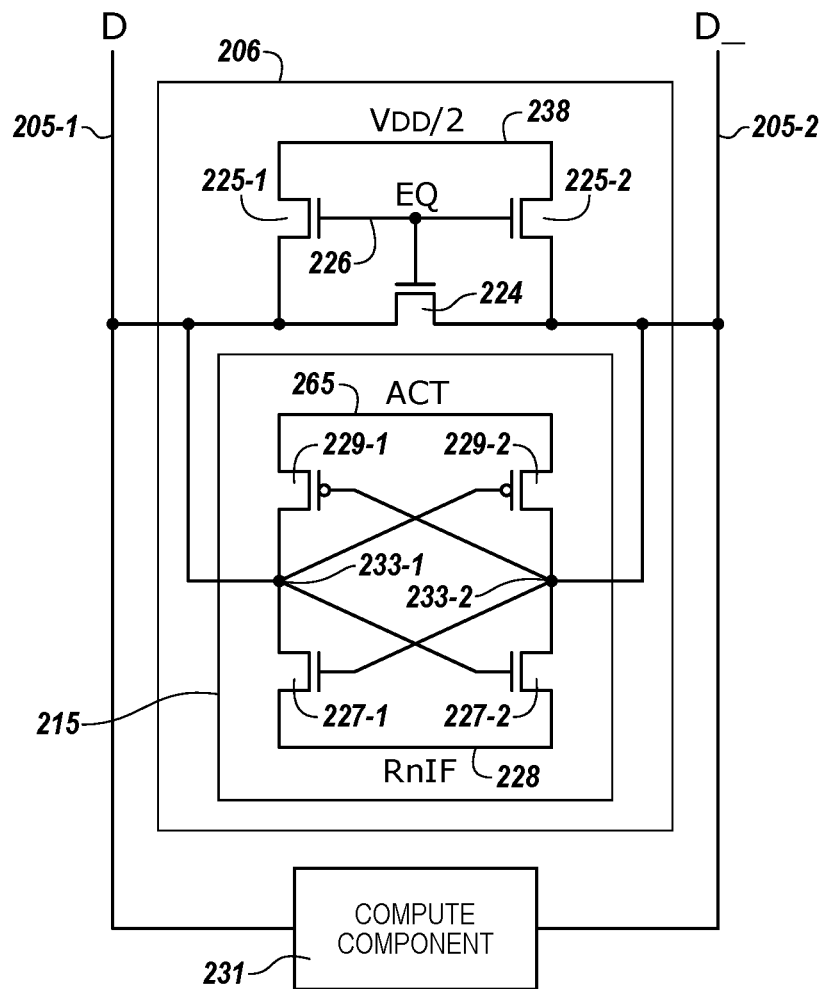

FIG. 2B illustrates a schematic diagram of a portion of sensing circuitry in accordance with a number of embodiments of the present disclosure. The portion of the sensing circuitry shown in FIG. 2B can correspond to a portion of the sensing circuitry 250 shown in FIG. 2A, for example. According to various embodiments, a sense amplifier 206 can comprise a cross coupled latch. However, embodiments of the sense amplifier 206 are not limited to a cross coupled latch. For example, the sense amplifier 206 in FIG. 2B can be current-mode sense amplifier and/or single-ended sense amplifier (e.g., sense amplifier coupled to one data line). Embodiments of the present disclosure also are not limited to a folded data line architecture.

In a number of embodiments, a sense amplifier 206 can comprise a number of transistors formed on pitch with the transistors of the corresponding compute component 231 and/or the memory cells of an array (e.g., memory array 130 shown in FIG. 1A) to which they are coupled, which may conform to a particular feature size (e.g., $4F^2$, $6F^2$, etc.). Sense amplifier 206 comprises a latch 215 including four transistors coupled to a pair of complementary data lines D 205-1 and D_ 205-2. The latch 215 can be a cross coupled latch. For example, the gates of a pair of transistors, such as n-channel transistors (e.g., NMOS transistors) 227-1 and 227-2 can be cross coupled with the gates of another pair of transistors, such as p-channel transistors (e.g., PMOS transistors) 229-1 and 229-2. As described further herein, the latch 215 comprising transistors 227-1, 227-2, 229-1, and 229-2 can be referred to as a primary latch. However, embodiments are not limited to this example. For example, in some embodiments, the ratio of at least some sense amplifiers to compute components may not be 1:1, as shown in FIGS. 2A-2B, such that a sense amplifier may not be coupled to a compute component or may be coupled to a plurality of compute components and/or a compute component may not be coupled to a sense amplifier or may be coupled to a plurality of sense amplifiers.

The voltages or currents on the respective data lines D and D_ can be provided to the respective latch inputs 233-1 and 233-2 of the cross coupled latch 215 (e.g., the input of the primary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231, which may be referred to herein as an accumulator, can be coupled to latch inputs 233-1 and 233-2 of the cross coupled latch 215 as shown. However, embodiments are not limited to the example shown in FIG. 2B.

In this example, a second source/drain region of transistors 227-1 and 227-2 can be commonly coupled to a negative control signal (RnIF) 228. A second source/drain region of transistors 229-1 and 229-2 can be commonly coupled to an active positive control signal (ACT) 265. The ACT signal 265 can be a supply voltage (e.g., $V_{DD}$) and the RnIF signal can be a reference voltage (e.g., ground). RnIF signal 228 and ACT signal 265 can function as activating signals that enable the cross coupled latch 215.

The enabled cross coupled latch 215 can operate to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 can be coupled to an equilibration voltage 238, which can be equal to $V_{DD}/2$, where $V_{DD}$ is a supply voltage associated with the array. The gates of transistors 224, 225-1, and 225-2 can be coupled to control signal 226 (EQ). As such, activating EQ can enable the transistors 224, 225-1, and 225-2, which can effectively short data line D to data line D_ such that the data lines D and D_ are equilibrated to equilibration voltage $V_{DD}/2$. As described herein, a number of logical operations and/or shift operations can be performed using the sense amplifier 206 and compute component 231, and the result can be at least temporarily stored in the sense amplifier and/or compute component.

The sensing circuitry 250 in FIG. 2A can be operated in several modes to perform logical operations, including a first mode in which a result of the shift operation and/or logical operation is initially stored in the sense amplifier 206, and a second mode in which a result of the shift operation and/or logical operation is initially stored in the compute component 231. Additionally with respect to the first operating mode, sensing circuitry 250 can be operated in both pre-sensing (e.g., sense amplifiers fired before operation control signal active) and post-sensing (e.g., sense amplifiers fired after operation control signal active) modes with a result of a shift operation and/or logical operation being initially stored in the sense amplifier 206.

As described herein, the sense amplifier 206 can, in conjunction with the compute component 231, be operated to perform various logical operations and/or shift operations (e.g., using data from an array as input). In a number of embodiments, the result of a logical operation and/or shift operation can be stored back to the array without transferring the data via a data line address access (e.g., without firing a column decode signal such that data is transferred to circuitry external to the array and sensing circuitry via local I/O lines). As such, a number of embodiments of the present disclosure can enable performing various operations (e.g., logical operations, shift operations, mathematical operations, etc.) using less power than various previous approaches. Additionally, because a number of embodiments can reduce or eliminate moving (e.g., transferring) data across I/O lines in order to perform operations (e.g., between memory and a discrete processor, which may be off pitch), a number of embodiments may enable an increased parallel processing capability as compared to previous approaches.

Figure 2C:
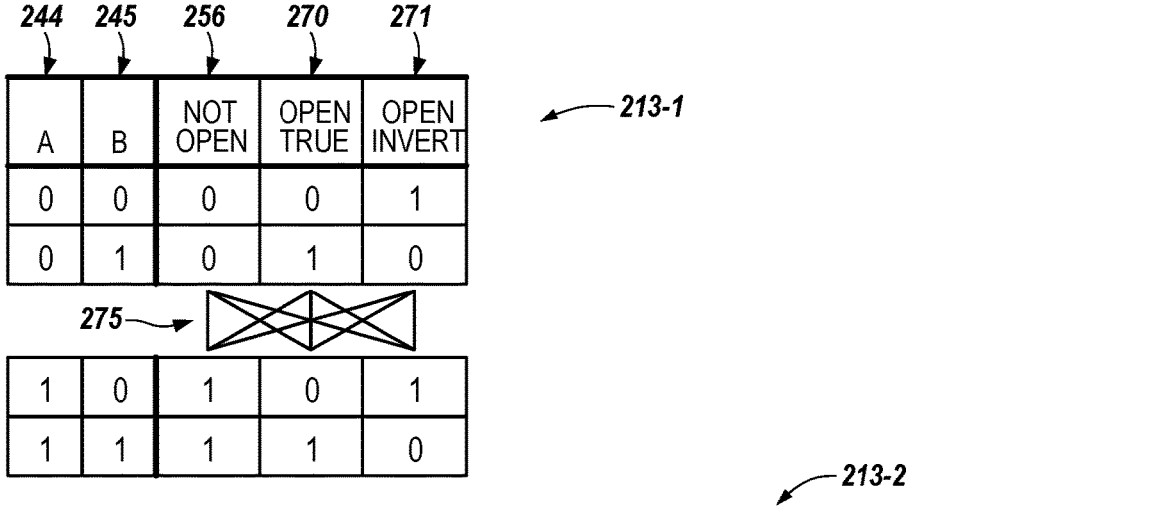
FIG. 2C shows logic tables illustrating selectable logical operation results implemented by sensing circuitry in accordance with a number of embodiments of the present disclosure.

FIG. 2C shows logic tables illustrating selectable logical operation results implemented by sensing circuitry in accordance with a number of embodiments of the present disclosure. The four logic selection control signals (e.g., TF, TT, FT, and FF) described in connection with the sensing circuitry 250 shown in FIG. 2A, in conjunction with a particular data unit (e.g., sensed on the complementary sense lines), can be used to select one of a plurality of logical operations to implement involving data units in the sense amplifier 206 and/or compute component 231. The four control signals, in conjunction with the particular data unit, controls the state (conducting or not conducting) of the pass gates 207-1 and 207-2 and swap transistors 242, which in turn affects the data unit in the compute component 231 and/or sense amplifier 206 before/after firing. The capability to selectably control the state of the swap transistors 242 facilitates implementing logical operations involving inverse data units (e.g., to inverse operands and/or inverse a result of an operation), among others.

Logic Table 213-1 illustrated in FIG. 2C shows the starting data unit stored in the compute component 231 in FIG. 2A shown in column A at 244, and the starting data unit stored in the sense amplifier 206 shown in column B at 245. The other three column headings in Logic Table 213-1 refer to the state of the pass gates 207-1 and 207-2 and the swap transistors 242, which can respectively be controlled to be OPEN (e.g., conducting/on) or CLOSED (e.g., not conducting/off) depending on the state of the four logic selection control signals (e.g., TF, TT, FT, and FF), in conjunction with a particular data unit (e.g., present on the pair of complementary sense lines 205-1 and 205-2) when the ISO control signal is activated. The "Not Open" column corresponds to the pass gates 207-1 and 207-2 and the swap transistors 242 both being in a non-conducting condition, the "Open True" corresponds to the pass gates 207-1 and 207-2 being in a conducting condition, and the "Open Invert" corresponds to the swap transistors 242 being in a conducting condition. The configuration corresponding to the pass gates 207-1 and 207-2 and the swap transistors 242 both being in a conducting condition is not reflected in Logic Table 213-1 because this can result in the sense lines being shorted together.

The logic tables illustrated in FIG. 2C can reflect a result initially stored in the compute component 231 in FIG. 2A. Therefore, when the pass gates 207-1 and 207-2 are controlled to be CLOSED (e.g., not conducting), the result initially stored in the compute component 231 is the same as the starting data unit in the compute component 231. However, because the sense sensing circuitry 250 is configured such that the sense amplifier 206 can overpower the compute component 231, as shown in the "Not Open" column 256 of the Logic Table 213-1, the result initially stored in the compute component 231 is the same as the starting data unit in the sense amplifier 206 when the pass gates 207-1 and 207-2 are controlled to be OPEN (e.g., conducting) as shown in the "Open True" column 270 of the Logic Table 213-1. The compute component 231 can be inverted as shown in the "Open Invert" column 271 when the swap transistors 242 are in a conducting condition.

Via selective control of the state of the pass gates 207-1 and 207-2 and the swap transistors 242, each of the three columns of the upper portion of Logic Table 213-1 can be combined with each of the three columns of the lower portion of Logic Table 213-1 to provide 3×3=9 different result combinations, corresponding to nine different logical operations, as indicated by the various connecting paths shown at 275. The nine different selectable logical operations that can be implemented by the sensing circuitry 250 are summarized in Logic Table 213-2 illustrated in FIG. 2C.

The columns of Logic Table 213-2 illustrated in FIG. 2C show a heading 280 that includes the state of logic selection control signals. For example, the state of a first logic selection control signal is provided in row 276, the state of a second logic selection control signal is provided in row 277, the state of a third logic selection control signal is provided in row 278, and the state of a fourth logic selection control signal is provided in row 279. The particular logical operation corresponding to the results is summarized in row 247.

For example, the results for the values of FF, FT, TF, and TT of "0000" are summarized as "A" because the result (initially stored in the compute component after the sense amplifier fires) is the same as the starting value in the compute component. Other columns of results are similarly annotated in row 247, where "A*B" intends A AND B, "A+B" intends A OR B, and "AXB" intends A XOR B. By convention, a bar over a data unit or a logical operation indicates an inverted value of the quantity shown under the bar. For example, AXB bar intends not A XOR B, which is also A XNOR B.

Accordingly, as described herein, mask patterns can be generated in memory from seed vectors by, in various embodiments, performing operations on a plurality of data units of a seed vector and generating, by performance of the operations, selectable lengths of vector elements in selectable mask patterns. The plurality of data units of a particular seed vector can be stored at least temporarily in a row of a subarray and/or in sensing circuitry as a continuous series of data units (e.g., a string of contiguous bits) for performance of the operations thereon. In some embodiments, the seed vector can be stored prior to performance of the operations thereon. The plurality of data units of the seed vector can be stored as a continuous series in a corresponding plurality of memory cells and/or in a corresponding plurality of at least one of a sense amplifier 206 and a compute component 231 in sensing circuitry 250, as described herein.

Mask patterns, as described herein can be used to define at least one of a beginning point and an end point of a sequential arithmetical operation (e.g., each of a plurality of sequential arithmetical operations) to be performed on data stored in a row of memory cells by generating a plurality of vector elements in each mask pattern. As described further in connection with examples shown in FIGS. 3A and 3B, a selected number of logical operations (e.g., Boolean logic) and/or shift operations can be performed to generate a repeating mask pattern that defines the vector element (e.g., 384 in FIG. 3A). As described herein, the repeating mask pattern can define a determined plurality of vector elements having various bit intervals.

The plurality of data units of the seed vector (e.g., one or more seed vectors) can, in some embodiments, be stored in a selected row 119 (e.g., one or more selectable rows) of a subarray 125. The plurality of data units of the seed vector (e.g., 355 in FIGS. 3A and 3B) can be moved (e.g., as directed by movement component 171) from the selected row to a sensing component stripe 124. The sensing component stripe 124 can include sensing circuitry 150 on pitch with sense lines of the selected row, the sensing circuitry 150 being selectably coupled to the selected row. The operations on the plurality of data units can be performed using the sensing component stripe, where the sensing component stripe comprises a sense amplifier 206 and a compute component 231 coupled to a respective sense line of a plurality of sense lines of the subarray. Hence, the operations can, in some embodiments, be performed on the respective plurality of data units of the seed vector using sensing circuitry 250 on pitch with and selectably coupled to memory cells in a row 119 in which the seed vector is stored. The operations can thus be performed on pitch with the plurality of memory cells in the memory device (e.g., without transferring data via an input/output (I/O) line for off pitch processing, for example, by a host).

In some embodiments, the plurality of data units of the seed vector can be stored initially in a sensing component stripe 124 with sensing circuitry 150 on pitch with and selectably coupled to sense lines of a selectable subarray. Hence, the number of operations can be performed on the respective plurality of data units using a number of a sense amplifiers and/or compute components in the sensing component stripe.

Figure 3A:
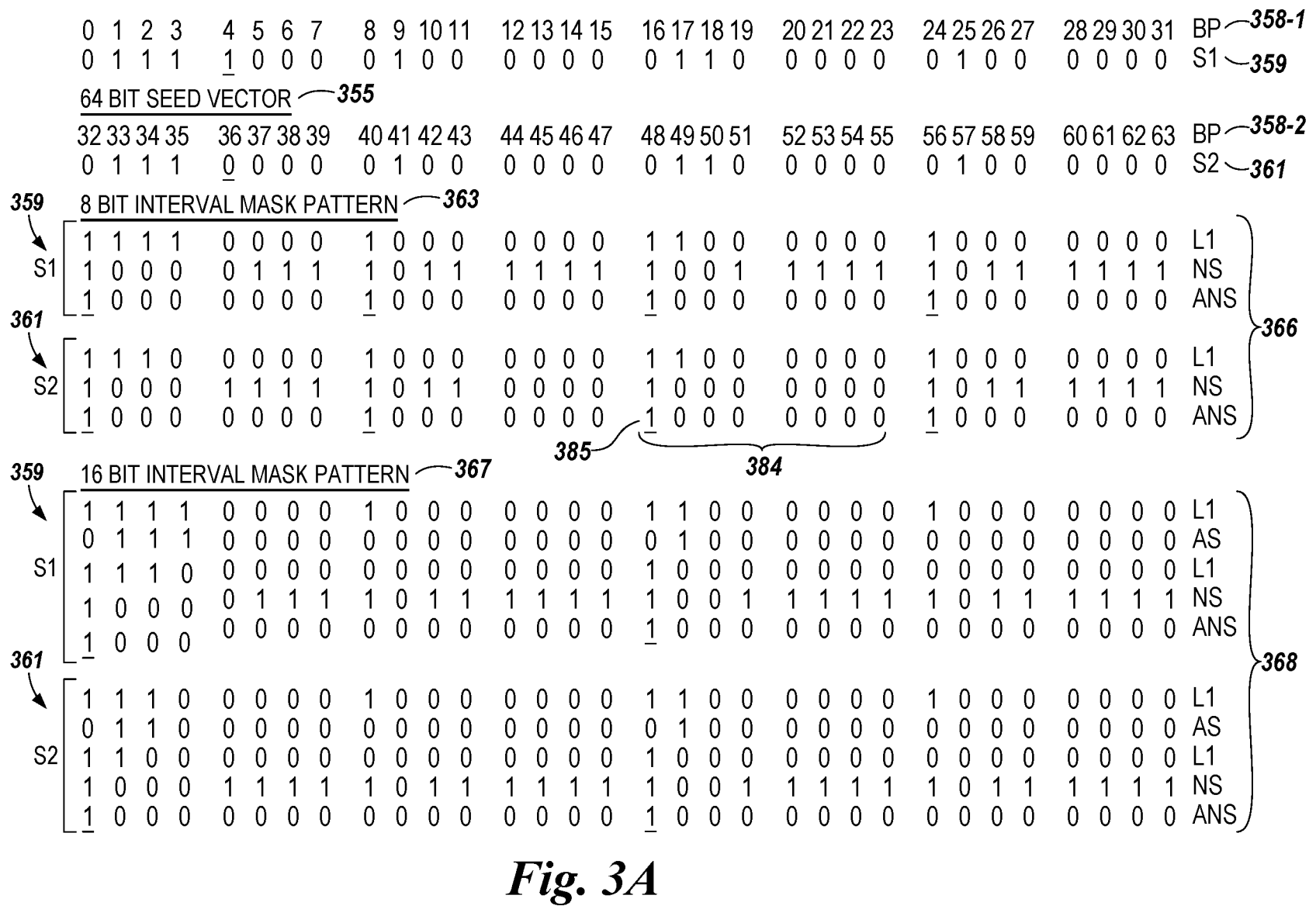

FIGS. 3A and 3B illustrate a table showing the states of data units in sensing circuitry in connection with an example of a seed vector and operations performed thereon in accordance with a number of embodiments of the present disclosure. As described herein, a number of different sequences of operations selected from logical operations and/or shift operations can be performed starting on the data units of a particular seed vector to generate multiple mask patterns having different bit interval lengths of the vector elements in each of the mask patterns. By way of example, the same 64-bit seed vectors 355 described previously is illustrated for clarity in both FIGS. 3A and 3B in binary notation as: 0111 1000 0100 0000 0110 0000 0100 0000 0111 0000 0100 0000 0110 0000 0100 0000.

In some embodiments, various seed vectors may have multiple sequences of data units therein. Some of the sequences may differ from each other by at least one data unit. For example, a seed vector (e.g., 64-bit seed vectors 355) can be formed as a plurality of adjacent sequences (e.g., first sequence S1 359 and second sequence S2 361) of a same number of a plurality of data units (e.g., each of sequences S1 and S2 having 32 bits of the 64-bit seed vector s). The 32 bit positions (BP) 358-1 of sequence S1 359 are shown as 0, 1, 2, . . . , 31 and the 32 BP 358-2 of sequence S2 361 are shown as 32, 33, 34, . . . , 63. As shown in FIGS. 3A and 3B, each of the plurality of data units in the adjacent sequences may be a multiple of 64 data units (e.g., each of the number of bits may be a factor of 64 higher than 1 and/or may be 64 multiplied by an integer).

At least one data unit in sequence S1 359 may, in some embodiments, differ from a data unit at a corresponding position in an adjacent sequence S2 361. For example, as shown in FIGS. 3A and 3B, the data unit at BP 4 of sequence S1 359 can have a binary value of 1, whereas the data unit at corresponding BP 36 of sequence S2 361 can have a binary value of 0, as indicated by underlining the differing data units.

Inclusion of differences between sequences of data units in the seed vectors may serve a number of functions. For example, such differences may help enable output of multiple mask patterns from the same seed vector. The differences between the sequences may contribute to generation of vector elements (e.g., vector element 384 in the 8-bit interval mask pattern 363 shown in FIG. 3A) of the intended bit interval lengths and/or the intended positioning of the high bit indicator (e.g., high bit indicator 385 in the vector element 384 shown in FIG. 3A) for each of the multiple mask patterns by performance of the selected shift and/or logical operations thereon, among other possible reasons (e.g., to distinguish one end of a seed vector from another end of the seed vector).

For example, as shown in FIG. 3A, a repeating vector element with an 8-bit interval length can be generated in an 8-bit interval mask pattern 363 by selectable performance of the following sequence of operations 366 on the 64-bit seed vectors 355: a←s; a←a SHIFT LEFT 1; a←a AND NOT s. For example, the data units of the 64-bit seed vectors 355 can be input to 64 sense amplifiers 206 and/or compute components 231 of sensing circuitry 250 (e.g., one of the 64 data units input into each of the 64 sense amplifiers and/or compute components, a multiple of which can correspond to a number of memory cells in a row). The SHIFT LEFT 1 operation can be performed on each of the 64 data units to shift each one data unit to the left (L1) (e.g., as described in connection with FIG. 2A) with a 0 binary data value inserted into the vacated BP 63. An invert (NS) logical operation can be performed on the data units of the original 64-bit seed vectors 355 (e.g., which can be input into the other of the sense amplifiers or compute components that are not storing the L1 data units) and an AND logical operation (ANS) (e.g., as described in connection with FIGS. 2A-2C) can be performed to generate the 8-bit interval mask pattern 363.

The generated 8-bit interval mask pattern 363 resulting from performance of the sequence of operations 366 is shown at performance of the last operation (e.g., ANS) for each of data unit sequence S1 359 and data unit sequence S1 361. The corresponding lengths of the vector elements and/or positions (BP 358-1, 358-2) of a high bit indicator are noted by an underlined 1 data value, for example, for each of the 8-bit interval lengths, in addition to the high bit indicators for the following 16-bit, 32-bit, and 64-bit interval lengths. As such, the result of the sequence of operations 366 performed on the 64-bit seed vector s 355 is vector element 1000 0000 in binary notation (0x80 in hexadecimal) with an 8-bit interval length repeated 8 times and with the high bit indicator (1) appearing at the first data unit of each of the vector elements, for example.

A repeating mask pattern generated as such can define a vector element 384 by generating a high bit indicator 385 (e.g., at a most significant bit position) at a bit interval (e.g., at predetermined and/or equal bit length intervals) in the mask pattern. The high bit indicator 385 can be generated for the bit interval by performing the operations on the respective plurality of data units of the seed vector. The high bit indicator 385 can, in various embodiments, be associated with at least one of a beginning and an end of the vector element. The high bit indicator 385 can be identified (e.g., by identifying a transition from 0 to 1 or vice versa by a controller 140) to define at least one of a corresponding beginning point and an end point of an operation to be performed on data of a vector element stored in a row of memory cells.

As shown in FIG. 3A, a repeating vector element with a 16-bit interval length can be generated in a 16-bit interval mask pattern 367 by selectable performance of the following sequence of operations 368 on the 64-bit seed vector s 355: a←s; a←a SHIFT LEFT 1; a←a AND s; a←a SHIFT LEFT 1; a←a AND NOT s. After input of the data units of the 64-bit seed vector s 355 into 64 sense amplifiers 206 and/or compute components 231, a first SHIFT LEFT 1 operation can be performed on each of the 64 data units to shift each one data unit to the left (L1). The data units of the original 64-bit seed vectors 355 can be input (e.g., into the other of the sense amplifiers or compute components that are not storing the L1 data units) and an AND logical operation (AS) (e.g., as described in connection with FIGS. 2A-2C) can be performed using the L1 data units and the data units of the original 64-bit seed vectors 355. A second L1 operation can be performed on the result of the preceding AND logical operation. An invert (NS) logical operation can be performed on the data units of the original 64-bit seed vectors 355 (e.g., which can be input into the other of the sense amplifiers or compute components that are not storing the second L1 data units) and an AND logical operation (ANS) can be performed to generate the 16-bit interval mask pattern 367.

The generated 16-bit interval mask pattern 367 resulting from performance of the sequence of operations 368 is shown at performance of the last operation (e.g., ANS) for each of data unit sequence S1 359 and data unit sequence S1 361. As such, the result of the sequence of operations 368 performed on the 64-bit seed vectors 355 is vector element 1000 0000 0000 0000 in binary (0x8000 in hexadecimal) with a 16-bit interval length repeated 4 times and with the high bit indicator (1) appearing at the first data unit of each of the vector elements, for example.

As shown in FIG. 3B, a repeating vector element with a 32-bit interval length can be generated in a 32-bit interval mask pattern 369 by selectable performance of the following sequence of operations 372 on the 64-bit seed vector s: a←s; a←a SHIFT LEFT 2; a←a AND s; a←a SHIFT LEFT 1; a←a AND NOT s. The sequence of operations 372 performed to generate the 32-bit interval mask pattern 369 is, in this example, similar to the sequence of operations 368 performed to generate the 16-bit interval mask pattern 367 except that the first operation is SHIFT LEFT 2 (L2) in the sequence of operations 372 for the 32-bit interval mask pattern 369 instead of SHIFT LEFT 1.

The generated 32-bit interval mask pattern 369 resulting from performance of the sequence of operations 372 is shown at performance of the last operation (e.g., ANS) for each of data unit sequence S1 359 and data unit sequence S1 361. As such, the result of the sequence of operations 372 performed on the 64-bit seed vectors 355 is vector element 1000 0000 0000 0000 0000 0000 0000 0000 in binary (0x80000000 in hexadecimal) with a 32-bit interval length repeated 2 times and with the high bit indicator (1) appearing at the first data unit of each of the vector elements, for example.

Alternatively, as shown in FIG. 3B, a repeating vector element with a 64-bit interval length can be generated in a 64-bit interval mask pattern 373 by selectable performance of the following sequence of operations 374 on the 64-bit seed vector s 355: a←s; a←a SHIFT LEFT 3; a←a AND s; a←a SHIFT LEFT 1. The sequence of operations 374 performed to generate the 64-bit interval mask pattern 373 is, in this example, similar to the beginning of the sequence of operations 368 performed to generate the 16-bit interval mask pattern 367 except that the first operation is SHIFT LEFT 3 (L3) in the sequence of operations 374 for the 64-bit interval mask pattern 373 instead of SHIFT LEFT 1. In addition, in this example, the sequence of operations 374 for the 64-bit interval mask pattern 373 is complete after performance of an L1 operation.

Hence, the 64-bit interval mask pattern 373 generated by performance of the sequence of operations 374 is shown at performance of the last operation (e.g., L1) for each of data unit sequence S1 359 and data unit sequence S1 361. As such, the result of the sequence of operations 374 performed on the 64-bit seed vectors 355 is vector element 1000 0000 0000 0000 0000 0000 0000 0000 0000 0000 0000 0000 0000 0000 0000 0000 in binary (0x8000000000000000 in hexadecimal) with a 64-bit interval length and with the high bit indicator (1) appearing at the first data unit of the vector element, for example.

Although the vector element with the 64-bit interval length only is generated once using the 64-bit seed vectors 355, a plurality of such 64-bit seed vectors may be arranged in sequence such that performance of, for example, the just-presented operations thereon generates a mask pattern having repeating vector elements each having a 64-bit interval length (e.g., that extends a length of a row of memory cells). In some embodiments, seed vectors may be used such that mask patterns having multiple vector elements with the 64-bit interval length may be generated therefrom (e.g., a 128-bit seed vector to generate 2 of such repeated 64-bit vector elements, a 256-bit seed vector to generate 4 of such repeated 64-bit vector elements, etc.). In addition, a plurality of the 64-bit seed vectors may be arranged in sequence such that performance of the corresponding sequence of operations, for example as described herein, generates extended mask patterns each having repeating vector elements selected from the 8-bit, 16-bit, and 32-bit interval lengths.

Hence, as described herein, a mask pattern to be generated can be selected from a plurality of different mask patterns defined as being generated by performance of a corresponding plurality of sets of operations on a plurality of data units of a seed vector. A different bit interval length of a vector element 384 (e.g., a plurality of sequential vector elements) can be generated in each different mask pattern by performing a corresponding set of operations on the respective plurality of data units of the seed vector. The corresponding set of operations is selectable from the plurality of sets of operations (e.g., the sequences of operations 366, 368, 372, and 374 shown in and described in connection with FIGS. 3A and 3B) to generate the different bit interval length of the vector element in a particular mask pattern.

For example, a process of generating a mask pattern can include selecting from different sets of logical operations (e.g., AND, AND NOT, among other such operations described herein,) and/or shift operations (e.g., SHIFT LEFT 1, SHIFT LEFT 2, SHIFT RIGHT 3, among others) to perform the corresponding plurality of sets of operations. Each different set of logical operations and/or shift operations can, in some embodiments, generate a repeating mask pattern having a bit interval length for a vector element that is different from a bit interval length generated by performance of other selectable sets of operations. For example, the corresponding plurality of sets of operations can, in various embodiments, include performing different sequences of operations selected from AND, AND NOT, and/or SHIFT operations (e.g., the order and/or the number of such operations varying between the sets of operations). As a result, each sequence of operations can generate a repeating mask pattern having a bit interval length for a vector element that is different from a bit interval length generated by performance of other selectable sequences of operations.

The generated mask pattern having a plurality of vector elements generated from the seed vector and the associated sequence of operations can be stored, for example, by storing the mask pattern at least temporarily in a row 119 of a subarray 125 and/or in sensing circuitry 250, as described herein. The generated mask pattern can be used to define at least one of beginning points and end points of a sequence of operations to be performed on data stored in a row of the memory cells by comparison to the generated mask pattern.

As described herein, a system 100, as shown and described in connection with FIGS. 1A and 1B, can include a memory device 120 having an array 130 of memory cells configured to store a number of seed vectors 170. The system 100 can include sensing circuitry 250, as shown and described in connection with FIGS. 2A-2C, formed on pitch with sense lines 205-1, 205-2 of the array and coupled to the array. The system 100 also can include a controller 140, as shown and described in connection with FIGS. 1A and 1B, configured to control the sensing circuitry 250. In some embodiments, the system 100 can include a hardware pattern generator (not shown) to create a seed vector to generate an intended pattern in a mask by performance of a number of operations on a plurality of data units of the seed vector.

The sensing circuitry 250 can, for example, be controlled to perform operations on a seed vector 355, as shown and described in connection with FIGS. 3A and 3B, and/or the array 130 to generate a vector element 384 (e.g., a plurality of vector elements) in a repeating mask pattern, as described herein. For example, the operations can include AND, AND NOT, and/or SHIFT operations, among other operations described herein, performed using the sensing circuitry 250. The operations can be performed without a sense line address access and/or without transferring data via an I/O line (e.g., without accessing and/or transferring data off pitch for processing, for example, by a host). In some embodiments, the sensing circuitry 250 can be coupled to each of a number of columns of complementary sense lines. The operations may, in some embodiments, be performed on a plurality of data units of the seed vector 355 using the sensing circuitry 250 selectably coupled to a row 119 in a subarray 125 in which the seed vector is stored. The sensing circuitry 250 may, in some embodiments, be configured to at least temporarily store a mask having the repeating mask pattern that defines a plurality of vector elements (e.g., for comparison to define at least one of beginning points and end points of a sequence of operations to be performed on data stored in a row of the memory cells).

The controller 140 can be configured to control the sensing circuitry 250 and/or the array 130 to perform the operations on the plurality of data units of the seed vector 355 to generate a repeating mask pattern 363, 367, 369, 373, as shown and described in connection with FIGS. 3A and 3B. By performance of the operations, the controller 140 can be configured to generate in the repeating mask pattern a vector element 384 having a high bit indicator 385 at a bit interval. The controller 140 can be further configured to identify the high bit indicator (e.g., identify a transition from 0 to 1 or vice versa) associated with at least one of a beginning and an end of the vector element 384. As described herein, a high bit indicator 385 can be used to define at least one of a corresponding beginning point and/or an end point of an operation to be performed on data stored in a row of the memory cells.

The controller 140 can be further configured, in some embodiments, to control movement 171 to the sensing circuitry 250 of the plurality of data units of the seed vector 355 from selected memory cells in which the seed vector is stored and control performance of the operations on the respective plurality of moved data units using the sensing circuitry 250. The controller 140 can be further configured, in some embodiments, to control generation of a different bit interval length of vector elements 384 in different mask patterns 363, 367, 369, 373 by performance of a corresponding set of operations on the respective plurality of data units of the seed vector 355. The controller 140 can be further configured, in some embodiments, to control performance of a plurality of sets of operations, each of the respective plurality of sets having a different sequence of operations selected from a number of logical operations and/or shift operations.

In some embodiments, operations can be performed on data units at corresponding positions in sequences of a plurality of seed vectors using a selected number of logical operations (e.g., Boolean logic) and/or shift operations, as described herein, to generate a repeating mask pattern that defines a vector element (e.g., a plurality of vector elements) in the mask pattern. In some embodiments, the positions in the sequences may correspond after at least one of the plurality of seed vectors has been shifted. For example, the plurality of seed vectors can be selected from a larger plurality of selectable seed vectors to generate an intended mask pattern from a plurality of different selectable mask patterns. The corresponding positions can indicate the positions of the data units in the selected seed vectors prior to performance of the logical operations and/or shift operations thereon. In some embodiments, different shift operations may be performed on each of the selected seed vectors such that the originally corresponding positions of the seed vectors no longer correspond (e.g., are no longer aligned in the sequences of data units) after initiation of the operations. For example, a shift left operation may be performed on one seed vector and no shift, or a shift right, operation may be performed on the other seed vector, among other possibilities.

The plurality of different selectable mask patterns are defined as being generated by performance of a corresponding plurality of sets of operations on selectable pluralities of the respective larger plurality of selectable seed vectors. For example, as shown in FIGS. 3A and 3B, the first sequence S1 359 and the second sequence S2 361 may represent a pair of different 32-bit seed vectors selectable from a larger set of selectable seed vectors (e.g., 8-bit, 16-bit, 32-bit, 64-bit, 128-bit, etc., seed vectors). The selected pair of seed vectors may, in various embodiments, differ at various corresponding positions in their sequences of data units. For example, the selected pair of seed vectors may differ at one corresponding position (e.g., as shown at BP 4 in sequence S1 relative to BP 36 in sequence S2) or the selected pair of seed vectors may differ at more than one corresponding position (e.g., potentially all corresponding positions) as long as at least one set of operations from the plurality of sets of operations can generate an intended mask pattern.

In some embodiments, a number of other seed vectors can be utilized in generation of the intended mask pattern. For example, after a first logical operation has been performed on the corresponding data units of a pair of seed vectors, the result may be combined with a third seed vector for performance of a third logical operation. Any number of selectable logical operations, shift operations, and/or seed vectors may be combined in generation of the intended mask pattern.

In addition to apparatuses configured as described herein reducing the overhead expense of mask generation (e.g., for $2^{20}$ data units in a mask pattern), more operations may be performed in parallel compared to an apparatus configured to use sensing circuits where data is moved off pitch for performance of logical operation and/or shift operation processing (e.g., using 32 or 64 bit registers). As such, higher throughput may be enabled using apparatuses configured as described herein compared to configurations involving an off pitch processing unit discrete from the memory such that data is transferred between the off pitch processing unit and the memory. Apparatuses configured as described herein also may use less energy per unit area than configurations where the logical and/or shift operations are performed at a location discrete from the memory.

While example embodiments including various combinations and configurations of memory devices, memory arrays, sensing circuitry, sense amplifiers, compute components, sensing component stripes, controllers, data movement components, and locations to at least temporarily store seed vectors, etc., have been illustrated and described herein, embodiments of the present disclosure are not limited to those combinations explicitly recited herein. Other combinations and configurations of the memory devices, memory arrays, sensing circuitry, sense amplifiers, compute components, sensing component stripes, controllers, data movement components, and locations to at least temporarily store seed vectors, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
performing, using sensing circuitry coupled to a memory array, a set of operations, including a plurality of different operations, on a plurality of data units of a single seed vector having a predetermined data unit at each bit position; and
generating, by performance of the set of operations, a vector element including a plurality of data units in a mask pattern; and
wherein the sensing circuitry performs the plurality of different operations without a sense line address access and without transferring data via an input/output (I/O) line.

2. The method of claim 1, wherein the single seed vector includes a continuous series of the data units on which the set including the plurality of different operations is performed.

3. The method of claim 1, wherein the set of operations is performed to generate a plurality of mask patterns having different bit interval lengths of vector elements.

4. The method of claim 1, wherein the method further comprises storing the plurality of data units of the single seed vector as a continuous series of data units in a corresponding plurality of memory cells.

5. The method of claim 1, wherein the method further comprises storing the plurality of data units of the single seed vector in a corresponding plurality of at least one of a sense amplifier and a compute component in sensing circuitry.

6. The method of claim 1, wherein the method further comprises generating a repeating mask pattern.

7. The method of claim 1, wherein the method further comprises performing the set including the plurality of different operations to generate a repeating mask pattern that defines the vector element.

8. A method, comprising:
generating a mask pattern including a plurality of data units by performing a plurality of different operations on data units of a single seed vector having a predetermined data unit at each bit position; and
identifying a high bit indicator associated with at least one of a beginning and an end of a vector element, wherein the identification of the high bit indicator reduces a probability that continued performance of an operation will result in data units not being in an intended bit interval length of the vector element;
wherein the generated mask pattern is selected from a plurality of different mask patterns.

9. The method of claim 8, wherein the single seed vector includes a continuous series of the data units on which the plurality of different operations are performed.

10. The method of claim 8, wherein the plurality of different operations are performed to generate a plurality of mask patterns having different bit interval lengths of vector elements.

11. The method of claim 8, wherein the plurality of different mask patterns are defined as being generated by performance of a corresponding plurality of sets including a plurality of different operations on the respective plurality of data units of the single seed vector.

12. The method of claim 8, wherein the method further comprises generating a different bit interval length of a vector element in each different mask pattern by performing a corresponding set including a plurality of different operations on the respective plurality of data units.

13. The method of claim 12, wherein the corresponding set including the plurality of different operations is selectable from a plurality of sets including a plurality of different operations to generate the different bit interval length of the vector element in a particular mask pattern.

14. The method of claim 8, wherein the method further comprises loading, in a computing system, the single seed vector at system boot or program start for generation of the mask pattern.

15. An apparatus, comprising:
an array of memory cells configured to store a seed vector having a predetermined data unit at each bit position;
sensing circuitry coupled to the array; and
a controller configured to control the sensing circuitry and/or the array to perform a plurality of different operations on the seed vector to generate a vector element in a repeating mask pattern;
wherein the sensing circuitry is further configured to perform the plurality of different operations without a sense line address access and without transferring data via an input/output (I/O) line.

16. The apparatus of claim 15, wherein the seed vector comprises a continuous series of the data units at each of the bit positions, and wherein the controller is configured to cause performance of the plurality of different operations on the continuous series of the data units.

17. The apparatus of claim 15, wherein the controller is configured to control the sensing circuitry to perform the plurality of different operations to generate a plurality of mask patterns having different bit interval lengths of vector elements that each includes a plurality of data units.

18. The apparatus of claim 15, wherein the sensing circuitry comprises a sense amplifier and a compute component coupled to a respective sense line.

19. The apparatus of claim 15, wherein:
the plurality of different operations comprises AND, AND NOT, and SHIFT operations performed using the sensing circuitry; and
the sensing circuitry is further configured to perform AND, AND NOT, and SHIFT operations without a sense line address access and without transferring data via an input/output (I/O) line.

* * * * *